United States Patent
Hashizume

(10) Patent No.: US 12,532,489 B2
(45) Date of Patent: Jan. 20, 2026

(54) SILICON CARBIDE SEMICONDUCTOR DEVICE

(71) Applicant: FUJI ELECTRIC CO., LTD., Kawasaki (JP)

(72) Inventor: Yuichi Hashizume, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 378 days.

(21) Appl. No.: 18/358,442

(22) Filed: Jul. 25, 2023

(65) Prior Publication Data
US 2024/0105858 A1 Mar. 28, 2024

(30) Foreign Application Priority Data

Sep. 27, 2022 (JP) ................. 2022-154184

(51) Int. Cl.
*H10D 8/60* (2025.01)
*H01L 21/04* (2006.01)
(Continued)

(52) U.S. Cl.
CPC ........... *H10D 8/60* (2025.01); *H01L 21/0465* (2013.01); *H01L 21/0475* (2013.01); *H01L 21/0485* (2013.01); *H10D 8/051* (2025.01); *H10D 62/104* (2025.01); *H10D 62/107* (2025.01); *H10D 62/8325* (2025.01)

(58) Field of Classification Search
CPC .......... H10D 8/051; H10D 8/60; H10D 8/605; H10D 64/64; H10D 64/647; H10D 64/649
See application file for complete search history.

(56) References Cited

U.S. PATENT DOCUMENTS 5,262,668 A * 11/1993 Tu ........................ H10D 8/605
257/478
6,404,033 B1 * 6/2002 Chang ................ H01L 21/2815
257/E27.068
(Continued)

FOREIGN PATENT DOCUMENTS

JP 2014116471 A 6/2014
JP 6400544 B2 10/2018
(Continued)

*Primary Examiner* — Eric A. Ward
(74) *Attorney, Agent, or Firm* — Rabin & Berdo, P.C.

(57) ABSTRACT

A silicon carbide semiconductor device includes an active region, a first-conductivity-type region, and a termination region. The active region has first second-conductivity-type regions and first silicide films in trenches, second second-conductivity-type regions and a second silicide film between the trenches that are adjacent to one another, and a first electrode while the termination region has a third second-conductivity-type region. The active region includes ohmic regions, non-operating regions and Schottky regions, each of which has a stripe shape. Each ohmic region is a region where the first electrode is in contact with either the first silicide film or the second silicide film. Each non-operating region is a region where the first electrode is in contact with either the first or second second-conductivity-type regions. Each Schottky region is a region where the first electrode forms a Schottky barrier junction with the first-conductivity-type region.

11 Claims, 17 Drawing Sheets

(51) Int. Cl.
*H10D 8/01* (2025.01)
*H10D 62/10* (2025.01)
*H10D 62/832* (2025.01)

(56) References Cited

U.S. PATENT DOCUMENTS

| | | | |
|---|---|---|---|
| 2005/0179104 A1* | 8/2005 | Shelton | H10D 62/126 |
| | | | 257/481 |
| 2015/0333190 A1 | 11/2015 | Aketa et al. | |
| 2016/0126306 A1* | 5/2016 | Sdrulla | H10D 8/60 |
| | | | 257/77 |
| 2017/0077236 A1 | 3/2017 | Hori et al. | |
| 2018/0308975 A1 | 10/2018 | Ohse et al. | |
| 2021/0074863 A1* | 3/2021 | Ohse | H10D 62/8325 |
| 2021/0175369 A1 | 6/2021 | Ohse et al. | |

FOREIGN PATENT DOCUMENTS

| | | |
|---|---|---|
| JP | 2021044272 A | 3/2021 |
| JP | 2021093522 A | 6/2021 |
| JP | 6930197 B2 | 9/2021 |

\* cited by examiner

SILICON CARBIDE SEMICONDUCTOR DEVICE

CROSS REFERENCE TO RELATED APPLICATIONS

This application is based upon and claims the benefit of priority of the prior Japanese Patent Application No. 2022-154184, filed on Sep. 27, 2022, the entire contents of which are incorporated herein by reference.

BACKGROUND OF THE INVENTION

1. Field of the Invention

Embodiments of the invention relate to a silicon carbide semiconductor device.

2. Description of the Related Art

Silicon carbide (SiC) semiconductors have gained attention in recent years as a semiconductor material that enables fabrication (manufacturing) of a semiconductor device (hereinafter, silicon carbide semiconductor device) that exceeds the limits of a semiconductor device in which a silicon (Si) semiconductor is used. In particular, silicon carbide semiconductors have high breakdown field strength and high thermal conductivity as compared to silicon semiconductors and by taking advantage of these features, application to high-voltage (for example, 1700V or greater) semiconductor devices is expected.

In an instance in which a silicon carbide semiconductor device is a diode (hereinafter, silicon carbide diode), design specifications of an $n^-$-type epitaxial layer that configures an $n^-$-type drift region may be set for a thin thickness and a high impurity concentration and therefore, silicon carbide diodes up to a breakdown voltage of about 3300V typically have a Schottky barrier diode (SBD) structure.

Normally, in an SBD structure, electric field strength is high at a contact surface of the semiconductor substrate in contact with a contact surface of the front electrode and a problem of increased reverse leakage current due to electrons tunneling the Schottky barrier when reverse voltage is applied or a problem of increased reverse leakage current due to surface defects unique to silicon carbide arises. Therefore, a silicon carbide diode has been proposed in which a junction barrier Schottky (JBS) structure having a mixture of Schottky barrier junctions and pn junctions on a front side of an n-type semiconductor substrate is adopted.

A structure of a silicon carbide diode in which a JBS structure is adopted is described as a structure of a conventional silicon carbide diode having an SBD structure. FIG. 27 is a cross-sectional view depicting the structure of the conventional silicon carbide semiconductor device.

A conventional silicon carbide semiconductor device 140 depicted in FIG. 27 is a vertical silicon carbide diode with a JBS structure having, in an active region 110, in a front side of the semiconductor substrate 130, a mixture of a SBD structure formed by Schottky barrier junctions between an $n^-$-type drift region 112 and a titanium film 131 constituting a front electrode 14 and pn junctions between $p^+$-type regions 113 and the $n^-$-type drift region 112. Further, a nickel silicide film 133 is provided on the $p^+$-type regions 113 as a lowermost layer of the front electrode 14.

The Schottky barrier junctions of the conventional silicon carbide semiconductor device 140 are formed by portions of the $n^-$-type drift region 112 exposed at a front surface of the semiconductor substrate 130 and the front electrode 14 configured by an aluminum alloy film 132 and the titanium film 131 provided on the front surface of the semiconductor substrate 130. The semiconductor substrate 130 is an epitaxial substrate in which an $n^-$-type epitaxial layer constituting the $n^-$-type drift region 112 is stacked on a front surface of an $n^+$-type starting substrate 111 that contains silicon carbide. The $n^+$-type starting substrate 111 constitutes an $n^+$-type cathode region. A back electrode 119 is provided in an entire area of a back surface of the semiconductor substrate 130 and is electrically connected to the $n^+$-type starting substrate 111. Reference numerals 115, 120, 121, and 122 are a field oxide film, an edge termination region, a field limiting ring (FLR), and a $p^-$-type region configuring a JTE structure, respectively.

The $p^+$-type regions 113 are selectively provided in surface regions of the semiconductor substrate 130, at the front surface thereof, in the active region 110. Between the $p^+$-type regions 113 that are adjacent to one another, portions of the $n^-$-type drift region 112 are exposed at the front surface of the semiconductor substrate 130. Pn junctions of the $p^+$-type regions 113 and the $n^-$-type drift region 112 are formed at the front surface of the semiconductor substrate 130. The portions of the $n^-$-type drift region 112 between the adjacent $p^+$-type regions 113 form Schottky barrier junctions with the titanium film 131 that is a lowermost layer of the front electrode 14 provided on the front surface of the semiconductor substrate 130.

FIG. 28 is a plan view depicting a layout when the conventional silicon carbide semiconductor device is viewed from a front side of the semiconductor substrate thereof. As depicted in FIG. 28, in the active region 110, the $p^+$-type regions 113 and the nickel silicide film 133 are provided forming a striped pattern and ends of the $p^+$-type regions 113 are connected the FLR 121 while the nickel silicide film 133 in the active region 110 is in contact with the nickel silicide film 133 on the FLR 121.

Due to this structure, when rated current flows in a forward direction, current flows in Schottky barrier junction regions of the $n^-$-type drift region 112 excluding the $p^+$-type regions 113. Furthermore, when surge current flows due to lightning strikes, since current cannot be limited to the Schottky barrier junction regions, the $p^+$-type regions 113 operate bipolarly, whereby current flows. Further, the nickel silicide film 133, which forms an ohmic region is provided on the $p^+$-type regions 113, whereby bipolar operation is facilitated only by the striped structure of the $p^+$-type regions 113.

Further, to enable suppression of device destruction during reverse bias, a semiconductor device has been proposed that has a trench-type JBS in which a p-type region is provided at a bottom of a trench formed in a device region (for example, refer to Japanese Patent No. 6400544).

Further, to enable reductions in a width of a contact trench in which a built-in SBD is formed at a sidewall and to reduce on-resistance, a semiconductor device has been proposed in which a Schottky metal is embedded in the contact trench, a Schottky barrier junction is formed with an $n^-$-type drift layer at the sidewall of the contact trench, and a $p^+$-type region is provided at a bottom of the contact trench (for example, refer to Japanese Patent No. 6930197).

SUMMARY OF THE INVENTION

According to an embodiment of the present invention, a silicon carbide semiconductor device includes: a semiconductor substrate containing silicon carbide, the semiconductor substrate having an active region and a termination region that surrounds a periphery of the active region, the semiconductor substrate having a first main surface and a second main surface that are opposite to each other; a first-conductivity-type region provided in the semiconductor substrate and exposed at the first main surface of the semiconductor substrate, the first-conductivity-type region having a first surface and a second surface that are opposite to each other, the second surface facing the semiconductor substrate; a plurality of first trenches provided in the first-conductivity-type region, from the first surface of the first-conductivity-type region, in the active region; a plurality of first second-conductivity-type regions provided, respectively, at respective ones of bottoms of the plurality of first trenches, in the active region, the plurality of first second-conductivity-type regions being in contact with the first-conductivity-type region; a first silicide film provided on a corresponding one of the plurality of first second-conductivity-type regions with which a first ohmic junction is formed; a plurality of second second-conductivity-type regions each provided between a corresponding adjacent two of the plurality of first trenches, in the active region, the plurality of second second-conductivity-type regions being in contact with the first-conductivity-type region; a second silicide film provided on a corresponding one of the plurality of second second-conductivity-type regions with which a second ohmic junction is formed; a first electrode in contact with the first silicide film, the plurality of first second-conductivity-type regions, the second silicide film, the plurality of second second-conductivity-type regions, and the first-conductivity-type region; a second electrode provided at the second main surface of the semiconductor substrate; and a third second-conductivity-type region provided in the termination region, the third second-conductivity-type region surrounding the active region. The active region includes a plurality of ohmic regions, each of which is a region where the first electrode is in contact with either the first silicide film where the first ohmic junction is formed or the second silicide film where the second ohmic junction is formed, a plurality of non-operating regions, each of which is a region where the first electrode is in contact with either one of the plurality of first second-conductivity-type regions or one of the plurality of second second-conductivity-type regions, each non-operating region not overlapping any of the plurality of ohmic regions in a plan view of the silicon carbide semiconductor device, and a plurality of Schottky regions, each of which is a region where the first electrode forms a Schottky barrier junction with the first-conductivity-type region, the plurality of ohmic regions, the plurality of non-operating regions, and the plurality of Schottky regions each a stripe shape.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
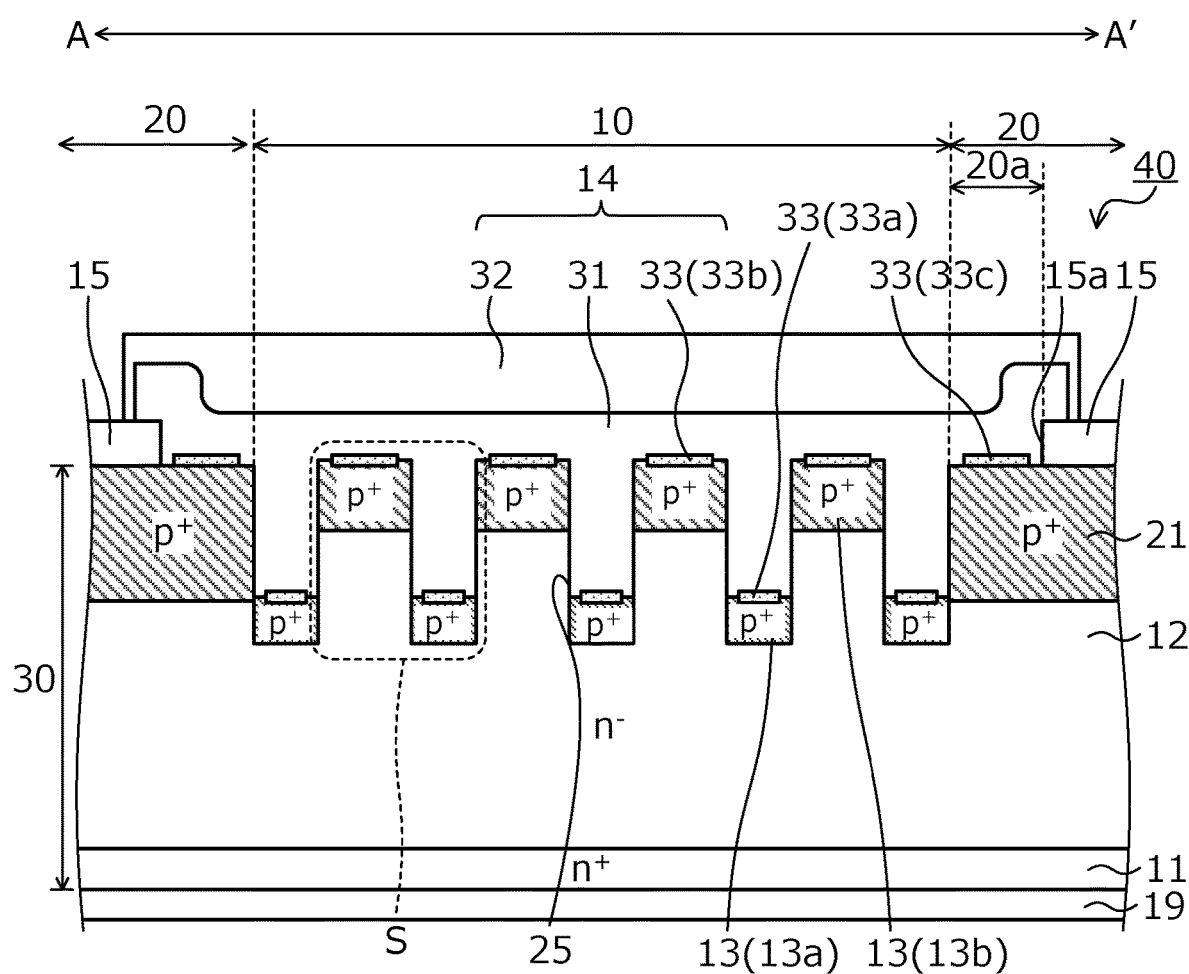
FIG. 1 is a cross-sectional view depicting a structure of a silicon carbide semiconductor device according to a first embodiment along cutting line A-A' in FIG. 2.

First, problems associated with the conventional techniques are discussed. When surge current flows in the p$^+$-type regions 113, the bipolar operation of the p$^+$-type regions 113 may be delayed due to the contact resistance of the p$^+$-type regions 113, whereby the semiconductor device may generate heat and be destroyed. Furthermore, when a p$^+$-type region is provided in addition to the normal stripe structure of the p$^+$-type regions 113, the area of Schottky barrier junction regions of the n$^-$-type drift region 112 decreases, forward voltage Vf at the time of the rated current increases and the on-voltage increases. As described, a trade-off occurs in that when the area of the p$^+$-type regions 113 is increased to ensure surge current capability (IFSM), Vf increases. Furthermore, in a structure in which ohmic regions on a semiconductor device are independent of each other such as a dot structure, a problem arises in that the resistance is biased, heat tends to be generated locally, and surge capability is difficult to ensure.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described. Further, in the present description, when Miller indices are described, "−" means a bar added to an index immediately after the "−", and a negative index is expressed by prefixing "−" to the index.

Figure 2:
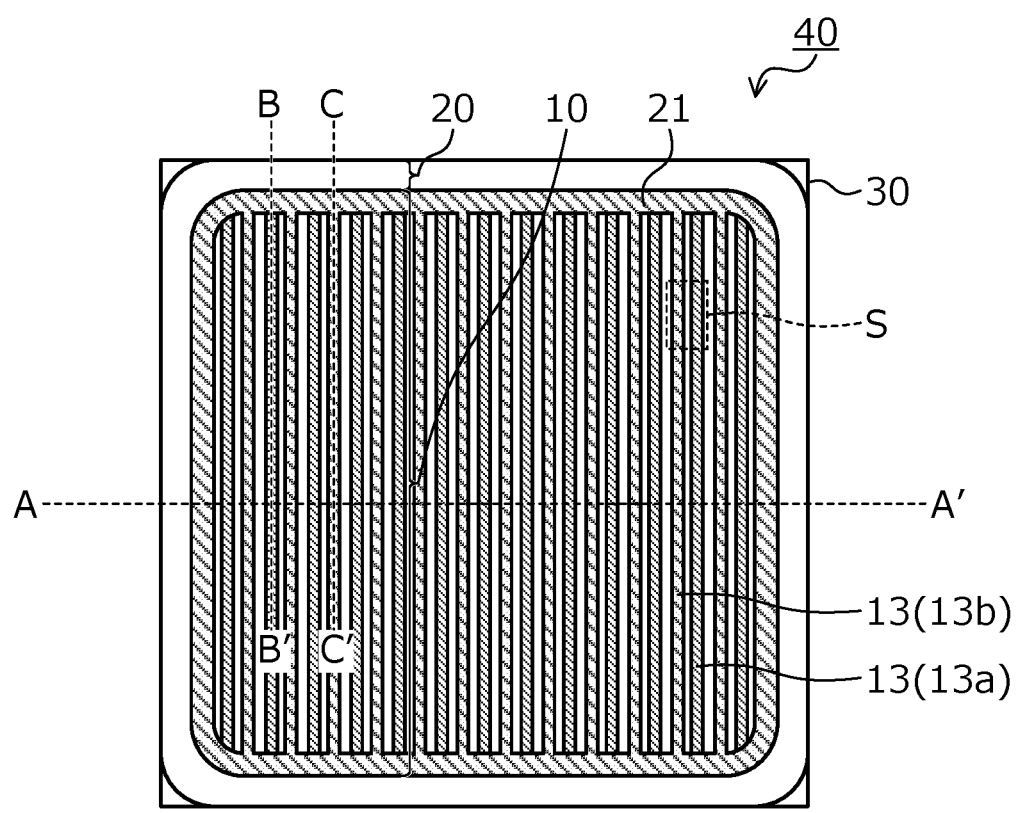
FIG. 2 is a plan view depicting a layout when the silicon carbide semiconductor device according to the first embodiment is viewed from a front side of a semiconductor substrate thereof.

A structure of a silicon carbide semiconductor device according to a first embodiment is described. FIG. 1 is a cross-sectional view depicting the structure of the silicon carbide semiconductor device according to the first embodiment along cutting line A-A' in FIG. 2. FIG. 2 is a plan view depicting a layout when the silicon carbide semiconductor device according to the first embodiment is viewed from a front side of a semiconductor substrate thereof. A silicon carbide semiconductor device 40 according to the first embodiment depicted in FIGS. 1 and 2 is a silicon carbide diode with a JBS structure having, in a semiconductor substrate 30, at a front surface (first main surface) thereof, a mixture of a SBD structure configured by a Schottky barrier junction between a front electrode (first electrode) 14 and an n$^-$-type drift region (first-conductivity-type region) 12, and pn diodes configured by pn junctions between p$^+$-type regions 13 and the n$^-$-type drift region 12, in an active region 10.

In the semiconductor substrate 30, at the front surface thereof in the active region 10, one or more p$^+$-type regions 13 each configuring a pn diode is selectively provided. Further, trenches (first trenches) 25 are provided at the surface of the active region 10 and the p$^+$-type regions 13 are constituted by first p$^+$-type regions (first second-conductivity-type regions) 13a provided at bottoms of the trenches 25, respectively, and second p$^+$-type regions (second second-conductivity-type regions) 13b provided, respectively, at surfaces of mesa portions between the trenches 25. The first p$^+$-type regions 13a and the second p$^+$-type regions 13b are disposed substantially evenly in a substantially uniform pattern at the surface of the active region 10. As depicted in FIG. 2, the first p$^+$-type regions 13a and the second p$^+$-type regions 13b, for example, extend in a striped pattern, in a same direction that is parallel to the front surface of the semiconductor substrate 30 and are disposed repeatedly alternating one another in a lateral direction that is orthogonal to a longitudinal direction in which the first p$^+$-type regions 13a and the second p$^+$-type regions 13b extend in the striped pattern. A depth of the first p$^+$-type regions 13a differs from a depth of the second p$^+$-type regions 13b and these regions are not connected to one another; thus, in FIG. 2, a gap is depicted between these regions. The n$^-$-type drift region 12 is exposed at sidewalls of the trenches 25 and forms a Schottky barrier junction with a front electrode 14.

The active region 10 is a region through with current flows when the silicon carbide diode is in an on-state. The active region 10, for example, has a substantially rectangular shape in a plan view of the silicon carbide semiconductor device 40 and is disposed in substantially a center of the semiconductor substrate 30. An edge termination region 20 is a region between the active region 10 and an end of the semiconductor substrate 30 and surrounds a periphery of the active region 10. The edge termination region 20 is a region of the n$^-$-type drift region 12, that mitigates electric field of the front side of the semiconductor substrate 30 and sustains a breakdown voltage. The breakdown voltage is a voltage limit at which no malfunction or destruction of the device occurs.

In the edge termination region 20, a voltage withstanding structure such as a junction termination extension (JTE) structure is disposed. The JTE structure is a voltage withstanding structure in which multiple p-type regions surround the periphery of the active region 10 in substantially rectangular shapes in a plan view of the silicon carbide semiconductor device 40, the p-type regions including p$^-$-type regions (not depicted) and p$^{--}$-type regions (not depicted) having different impurity concentrations, respectively, and being disposed in descending order of concentration in a direction from the center of the semiconductor substrate 30 to the end of the semiconductor substrate 30.

Further, a field limiting ring (FLR) 21 is disposed in a connecting region 20a of the edge termination region 20. As depicted in FIG. 2, the FLR 21 (third second-conductivity-type region) 21 is a p$^+$-type region that surrounds the periphery of the active region 10 in substantially a rectangular shape, extends toward the end of the semiconductor substrate 30 from the connecting region 20a of the edge termination region 20, and is in contact with a later-described p-type region. As depicted in FIG. 1, the FLR 21 is provided in the semiconductor substrate 30, at the surface thereof, and is deeper than the trenches 25. Thus, a sidewall of the FLR 21 covers an entire area of an outermost sidewall (sidewall closest to the edge termination region 20) of an outermost one of the trenches 25 closest to the edge termination region 20 and is in contact with the first p$^+$-type regions 13a. Further, the lower surface (surface facing the second main surface) of the FLR 21 is deeper than the trenches 25 and shallower than lower surfaces (surfaces facing second main surface) of the first p$^+$-type regions 13a. As a result, from the outermost ones of the trenches 25 closest to the edge termination region 20, leakage of current from a Schottky region 82 during reverse bias (refer to FIG. 3) may be prevented. In FIG. 2, while only one FLR 21 is provided, configuration may be a double structure of two FLRs 21 surrounding the periphery of the active region 10. The FLR 21 has an impurity concentration that is a same as that of the p$^+$-type regions 13.

The connecting region 20a of the edge termination region 20 is a region between the active region 10 and a later-described field oxide film 15, surrounds the periphery of the active region 10, and connects the active region 10 and a voltage withstanding structure portion of the edge termination region 20. The voltage withstanding structure portion of the edge termination region 20 is a portion of the edge termination region 20, from an inner end (end facing the center of the semiconductor substrate 30) of the later-described field oxide film 15 to the end of the semiconductor substrate (chip end) and a predetermined voltage withstanding structure such as the JTE structure, an n$^+$-type channel stopper region (not depicted), etc. is disposed therein.

The front electrode 14 is provided on the front surface of the semiconductor substrate 30, in the active region 10. The front electrode 14 is in contact with the n$^-$-type drift region 12 and the p$^+$-type regions 13 and is electrically connected to the n$^-$-type drift region 12 and the p$^+$-type regions 13. On the front surface of the semiconductor substrate 30, a passivation film (not depicted) is provided. The passivation film functions as a protective film that protects a device structure of the front side of the semiconductor substrate 30 and the front electrode 14.

The semiconductor substrate 30 is an epitaxial substrate in which an n$^-$-type epitaxial layer constituting the n$^-$-type drift region 12 is stacked on a front surface of an n$^+$-type starting substrate 11 that contains silicon carbide. The n$^+$-type starting substrate 11 constitutes an n$^+$-type cathode region. The semiconductor substrate 30 has, as the front surface, a main surface having the n$^-$-type drift region 12 (surface of the n$^-$-type epitaxial layer that constitutes the n$^-$-type drift region 12) and has, as a back surface (second main surface), a main surface having the n$^+$-type starting substrate 11 (back surface of the n$^+$-type starting substrate 11).

In the edge termination region 20, in the semiconductor substrate 30, at the front surface thereof, the FLR 21, one or more p-type regions (not depicted) configuring the JTE structure, and the n$^+$-type stopper region (not depicted) are each selectively provided. The FLR 21 is provided in an entire area of the connecting region 20a of the edge termination region 20, extends toward the chip end from the connecting region 20a, and is in contact with the one or more p-type regions configuring the JTE structure. The active region 10 is on an inner side (side facing the center of the semiconductor substrate 30) of the FLR 21.

The one or more p-type regions configuring the JTE structure is apart from the connecting region 20a of the edge termination region 20, is provided closer to the chip end than is the FLR 21, and is adjacent to the FLR 21. The n$^+$-type channel stopper region is provided closer to the chip end than is the p$^-$-type region and is apart from the p$^-$-type region. The n$^+$-type channel stopper region is exposed at the end of the semiconductor substrate 30 (the chip end).

The FLR 21, the one or more p-type regions configuring the JTE structure, and the n$^+$-type channel stopper region are provided between the front surface of the semiconductor substrate 30 and the n$^-$-type drift region 12. The FLR 21, the one or more p-type regions configuring the JTE structure, and the n$^+$-type channel stopper region are exposed at the front surface of the semiconductor substrate 30 and are in contact with the n$^-$-type drift region 12. A depth of the FLR 21, for example, may be a same as a depth of the trenches 25 or may be deeper than is the depth of the trenches 25. Depths of the one or more p-type regions configuring the JTE structure and the n$^+$-type channel stopper region, for example, may be a same as a depth of the second p$^+$-type regions 13b.

The front surface of the semiconductor substrate 30 is covered by the field oxide film 15. The field oxide film 15, for example, may be a stacked film in which a thermal oxide film and a deposited oxide film are sequentially stacked in the order stated herein. The thermal oxide film may enhance adhesiveness between the semiconductor substrate 30 and the field oxide film 15. The field oxide film 15 includes the deposited oxide film, whereby the field oxide film 15 may be formed in less time as compared to an instance in which the field oxide film 15 is entirely a thermal oxide film.

In the field oxide film 15, a contact hole 15a that exposes an entire area of the front surface of the semiconductor substrate 30 in the active region 10 is provided. The contact hole 15a of the field oxide film 15 has a sidewall (side surface of the field oxide film 15 facing the chip center) that, for example, is substantially orthogonal to the front surface of the semiconductor substrate 30. The contact hole 15a of the field oxide film 15 is provided in an entire area of the active region 10 and the connecting region 20a of the edge termination region 20.

In the contact hole 15a of the field oxide film 15, the n$^-$-type drift region 12 and the p$^+$-type regions 13 in the active region 10 and a portion closer to the chip center than is the FLR 21 in the edge termination region 20 are exposed. In the contact hole 15a of the field oxide film 15, on the front surface of the semiconductor substrate 30, the front electrode 14 that functions as an anode electrode is provided along the front surface of the semiconductor substrate 30.

The front electrode 14 has a stacked structure in which a titanium film 31 and an aluminum alloy film (metal electrode film containing aluminum) 32 are sequentially stacked in the order stated herein. In addition, the front electrode 14 has a lowermost layer constituted by nickel silicide (NiSi) films 33 (33a, 33b, 33c) selectively provided between the front surface of the semiconductor substrate 30 and the titanium film 31. The nickel silicide films 33 contain aluminum. The nickel silicide films 33 may contain carbon (C). The front electrode 14 may extend toward the chip end, on the field oxide film 15.

The titanium film 31 is provided in an entire area of the front surface of the semiconductor substrate 30 in the contact hole 15a and is in contact with the n$^-$-type drift region 12. A bonding portion of the titanium film 31 bonded to the n$^-$-type drift region 12 is a Schottky electrode that forms a Schottky barrier junction with the n$^-$-type drift region 12. The titanium film 31 may extend toward the chip end, on the field oxide film 15 and, for example, may terminate at a position facing the FLR 21 in a depth direction.

The aluminum alloy film 32 covers an entire surface of the titanium film 31, is electrically connected to the titanium film 31, and via the titanium film 31, is electrically connected to the nickel silicide films 33. The aluminum alloy film 32 may extend closer to the chip end, on the field oxide film 15, than is the titanium film 31 and, for example, may terminate at a position that faces the FLR 21 in the depth direction. The aluminum alloy film 32, for example, is an aluminum silicon (AlSi) film. Instead of the aluminum alloy film 32, an aluminum film may be provided.

The nickel silicide films 33 include first nickel silicide films (first silicide films) 33a provided between the first $p^+$-type regions 13a and the titanium film 31, second nickel silicide films (second silicide films) 33b between the second $p^+$-type regions 13b and the titanium film 31, and a third nickel silicide film 33c provided between the FLR 21 and the titanium film 31. The third nickel silicide film 33c is provided in a substantially rectangular shape and has an end that is in contact with the second nickel silicide films 33b. The first nickel silicide films 33a are an ohmic electrode forming ohmic junctions with the first $p^+$-type regions 13a and the second nickel silicide films 33b are an ohmic electrode forming ohmic junctions with the second $p^+$-type regions 13b. The first nickel silicide films 33a and the second nickel silicide films 33b have a function of enhancing the surge current capability by increasing the amount of surge current pulled out (pulled out amount) to the front electrode 14 from inside the semiconductor substrate 30, where the surge current is generated and flows in a forward direction when surge voltage is applied.

The nickel silicide films 33, as described hereinafter, at contact locations between the $p^+$-type regions 13 and a metal material film 52 (refer to FIG. 12) deposited on the front surface of the semiconductor substrate 30, are formed by causing surface regions of the semiconductor substrate 30 and the metal material film 52 to react with each other by a heat treatment.

Figure 3:
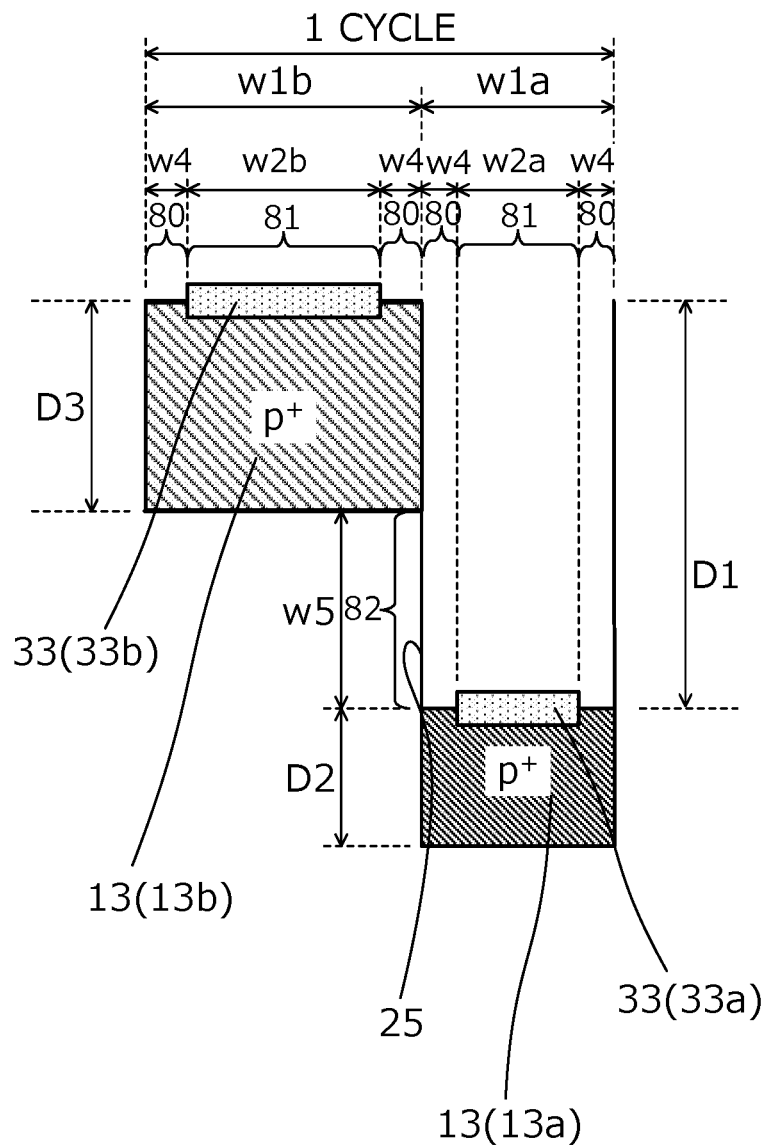
FIG. 3 is a cross-sectional view depicting a detailed structure of a region S surrounded by a dashed line in FIGS. 1 and 2.

FIG. 3 is a cross-sectional view depicting a detailed structure of a region S surrounded by a dashed line in FIGS. 1 and 2. As depicted in FIG. 3, the region S is a trench structure in which a fine ohmic stripe-like structure is provided at a bottom of the trench structure having a stripe-shape. The trenches 25 are provided at the front surface of the semiconductor substrate 30; the second $p^+$-type regions 13b are provided in portions of the $n^-$-type drift region 12 at the surface thereof between the trenches 25; and the first $p^+$-type regions 13a are provided at bottoms of the trenches 25. As described, the structure is such that the area of the ohmic regions is increased to be equivalent to the area of the active region. The area of the ohmic regions is increased, whereby the flow of current to the $p^+$-type regions 13 is facilitated during a surge and the surge capability (IFSM) may be ensured. For example, preferably, a width w1b (width of the second $p^+$-type regions 13b) between the trenches 25 may be in a range of 1 μm to 4 μm; a width w1a of each of the trenches 25 (width of each of the first $p^+$-type regions 13a) may be in a range of 0.5 μm to 4.5 μm; and a depth D1 of each of the trenches 25 may be in a range of 2 μm to 5 μm. Further, preferably, a depth D2 of each of the first $p^+$-type regions 13a and a height D3 of each of the second $p^+$-type regions 13b may be in a range of 0.2 μm to 1 μm.

The front electrode 14 is embedded in the trenches 25 and the sidewalls of the trenches 25 are in contact with the front electrode 14. Thus, the area of the SBD structure formed by the Schottky barrier junction between the front electrode 14 and the $n^-$-type drift region 12 increases the deeper the trenches 25 are formed, the on-voltage increases, and Vf may be reduced.

The first nickel silicide films 33a are provided in the trenches 25 and the second nickel silicide films 33b are provided between the trenches 25, whereby the surface area of the nickel silicide films 33 may be increased. Thus, the flow of current to the $p^+$-type regions 13 during a surge is facilitated and the surge current capability (IFSM) may be ensured. By adopting the configuration described, the first embodiment enables improvement of the characteristics of both the surge current capability and the on-voltage.

FIG. 3 is a cross-sectional view depicting the ohmic regions, non-operating regions, the Schottky region of the silicon carbide semiconductor device according to the first embodiment. The active region 10 is configured by non-operating regions 80, ohmic regions 81 and Schottky regions 82. The non-operating regions 80 each have a stripe-shape and are regions in which the titanium film 31 is in contact with the first $p^+$-type regions 13a and the second $p^+$-type regions 13b that configure the pn diodes. The ohmic regions 81 each have a stripe-shape and are regions in which the titanium film 31 forms ohmic contacts with the first $p^+$-type regions 13a and the second $p^+$-type regions 13b via the first nickel silicide films 33a and the second nickel silicide films 33b. In other words, the ohmic regions 81 are regions in which the titanium film 31 is in contact with either the first nickel silicide films 33a where the ohmic junctions are formed with the first $p^+$-type regions 13a or the second nickel silicide films 33b where the ohmic junctions are formed with the second $p^+$-type regions 13b. The ohmic regions 81 do not overlap any of the non-operating regions 80 in the plan view. The Schottky regions 82 each have a stripe-shape and are regions in which the titanium film 31 forms a Schottky barrier junction with the $n^-$-type drift region 12. In this manner, in the active region 10, one cycle having six regions including two of the ohmic regions 81, two pairs of the non-operating regions 80 respectively surrounding the ohmic regions 81, and the Schottky region 82 is repeatedly disposed. A strip-shape, as depicted in FIG. 2, is an elongated rectangular shape that is shorter in a horizontal direction than in a vertical direction.

By this cyclic structure, the ohmic regions 81 may be disposed uniformly at a high density in an entire area of the active region 10. Therefore, when large surge current flows in the forward direction in the semiconductor substrate, the surge current may be distributed and IFSM characteristics may be increased.

Further, the width w1a of each of the first $p^+$-type regions 13a is wider than a width w2a of each of the first nickel silicide films 33a and the width w1b of the second $p^+$-type regions 13b is wider than a width w2b of the second nickel silicide films 33b, whereby the non-operating regions 80 are provided. The non-operating regions 80 are regions other than ohmic regions (the nickel silicide films 33) on the first $p^+$-type regions 13a and the second $p^+$-type regions 13b. In this manner, by providing the non-operating regions 80, ohmic regions do not extend outside of the first $p^+$-type regions 13a and the second $p^+$-type regions 13b and leakage current may be suppressed. Here, the width w2b of the second nickel silicide films 33b may be a same width as the width w1b of the second $p^+$-type regions 13b. In this instance, while w4=0, the second $p^+$-type regions 13b exposed at the sidewalls of the trenches 25 function as the non-operating regions 80.

Here, preferably, an amount of the area of the non-operating regions 80 with respect to the surface area of the silicon carbide semiconductor device 40 may be in a range of 5% to 35%. Further, preferably, an amount of the area of the non-operating regions 80 with respect to the surface area of the first p⁺-type regions 13a and the second p⁺-type regions 13b may be in a range of 35% to 90%. Further, the surface area of the active region 10 is substantially the same as the surface area of the p⁺-type regions 13 and therefore, the amount of the area of the non-operating regions 80 with respect to the surface area of the active region 10 is the same as the amount of the area of the non-operating regions 80 with respect to the surface area of the p⁺-type regions 13.

Here, the amount of the area of the non-operating regions 80 with respect to the surface area of the silicon carbide semiconductor device 40 is the surface area of the non-operating regions 80/the surface area of the silicon carbide semiconductor device 40. The surface area of the silicon carbide semiconductor device 40 is a sum of the surface area of the active region 10 and the surface area of the edge termination region 20. Assuming lengths of the non-operating regions 80 and the p⁺-type regions 13 and the length of the active region 10 in a longitudinal direction thereof are common thereamong "w", as depicted in FIG. 3, in an instance in which the ohmic regions 81 are provided one by one alternating one another, the area of the non-operating regions 80 is (4×w4)×w. Further, the amount of the area of the non-operating regions 80 with respect to the surface area of the p⁺-type regions 13 is the surface area of the non-operating regions 80/the surface area of the p⁺-type regions 13 and in the instance of FIG. 3, the surface area of the p⁺-type regions 13 and the surface area of the active region 10 is (w1a+w1b)×w. The described calculation formulas are for an instance in which connection portions between the p⁺-type regions 13 and the FLR 21 are right angles and in an instance in which the connection portions between the p⁺-type regions 13 and the FLR 21 have a curved shape, consideration of an impact of this is necessary.

Figure 4:
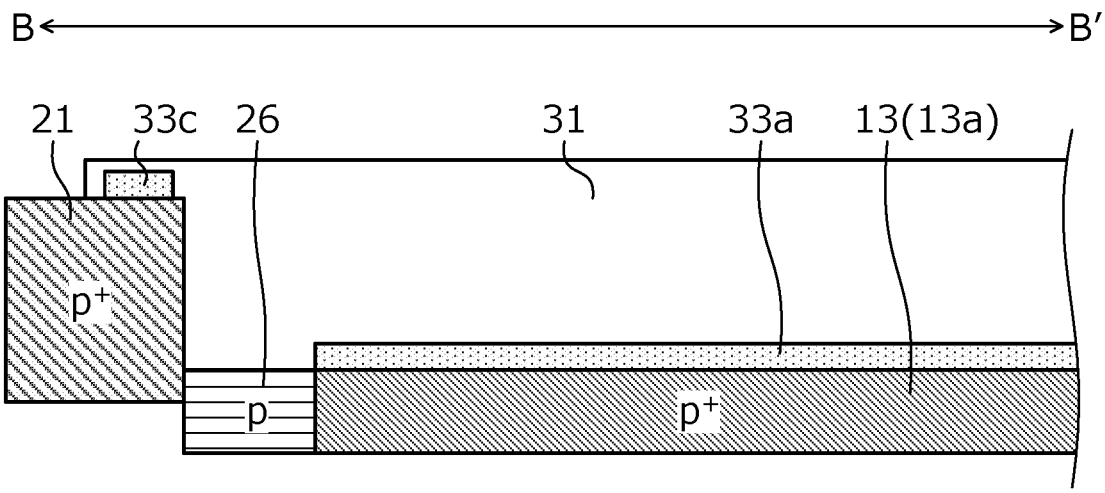
FIG. 4 is a cross-sectional view of the structure of the silicon carbide semiconductor device according to the first embodiment along cutting line B-B' in FIG. 2.
Figure 5:
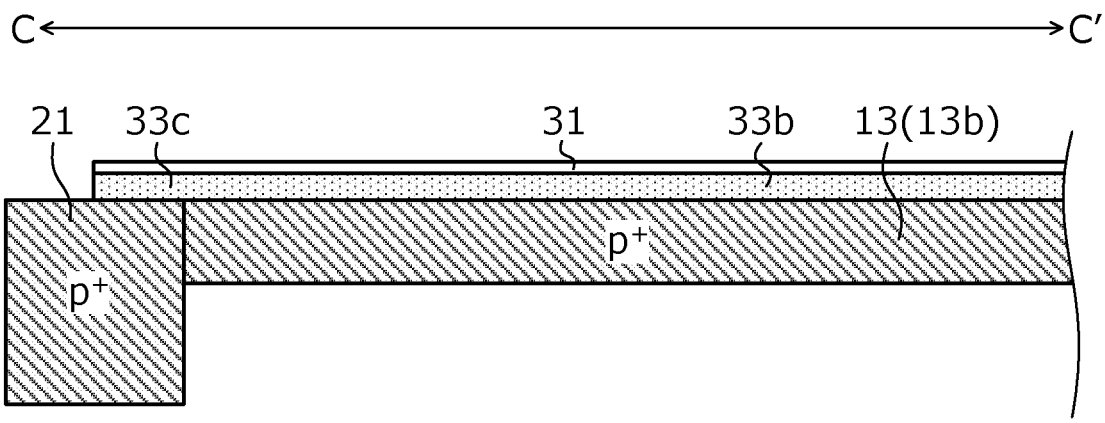
FIG. 5 is a cross-sectional view of the structure of the silicon carbide semiconductor device according to the first embodiment along cutting line C-C' in FIG. 2.

FIG. 4 is a cross-sectional view of the structure of the silicon carbide semiconductor device according to the first embodiment along cutting line B-B' in FIG. 2. FIG. 5 is a cross-sectional view of the structure of the silicon carbide semiconductor device according to the first embodiment along cutting line C-C' in FIG. 2. As depicted in FIG. 4, in the longitudinal direction, while the first p⁺-type regions 13a are not in contact with the FLR 21 provided in the edge termination region 20, as depicted in FIG. 5, in the longitudinal direction, the second p⁺-type regions 13b are in contact with the FLR 21 provided in the edge termination region 20.

In other words, in the edge termination region 20, while the ohmic regions (the second nickel silicide films 33b) provided between the trenches 25 are in contact with the FLR 21, the ohmic regions (the first nickel silicide films 33a) provided in the trenches 25 are apart from the FLR 21 and a p-type non-operating region (second-conductivity-type non-operating region) 26 free of the first nickel silicide films 33a is provided between the FLR 21 and the ohmic regions (the first nickel silicide films 33a). Preferably, a width of the p-type non-operating region 26 may be in a range of 0.1 μm to 1 μm. As a result, during reverse bias, a leakage of current from the Schottky region 82 in the trenches 25 may be prevented. Further, in an instance in which the third nickel silicide film 33c is further provided at the FLR 21, the second nickel silicide films 33b of the ohmic regions 81 are connected to the third nickel silicide film 33c.

In a conventional configuration in which a dot-shaped ohmic electrode is disposed, in a vicinity of an outer peripheral portion, a portion relatively far from the ohmic electrode and a portion relatively close thereto occur; however, in the first embodiment, even in the vicinity of the outer peripheral portion, the ohmic electrodes are evenly disposed.

As a result, during the flow of surge current, this current may be more evenly distributed and local concentration of the current may be circumvented, whereby IFSM characteristics may be improved. Further, the non-operating regions 80 are between the ohmic regions 81 and the Schottky region 82 without fail. As a result, the non-operating regions 80 pass carriers through the ohmic regions 81, whereby leakage current may be reduced.

Further, the non-operating regions 80 are provided around the ohmic regions 81 and thus, in the active region 10, the ohmic regions 81 are apart from one another. In other words, between any one of the first nickel silicide films 33a and an adjacent one of the second nickel silicide films 33b, the non-operating regions 80 and the Schottky region 82 are present. In this manner, the first embodiment is free of wide ohmic regions that straddle multiple stripes of the ohmic regions 81. As a result, the area of the ohmic regions 81 does not increase, whereby Vf characteristics may be maintained.

The described structure, for example, as described hereinafter, may be formed using a nickel silicide generated by causing a surface region of the semiconductor substrate 30 and the metal material film 52 in which nickel, aluminum, and nickel are sequentially deposited in the order stated herein to react with each other by a heat treatment. The generated nickel silicide has portions of the metal material film 52 not converted into a silicide (portions excluding a heated reacted layer) and the nickel silicide films 33, which have a low resistance, are formed by self-alignment by removing the unconverted portions of the metal material film 52 by etching. The metal material film 52 in which nickel, aluminum, and nickel are deposited sequentially is used, whereby a p-type ohmic electrode having low resistance is formed. Further, formation is by self-alignment, whereby the ohmic electrode is formed at an inner side of the JBS structure having a width of a few μm and Vf characteristics may be maintained. As described, the ohmic regions 81, which have a low resistance, may be formed without reducing the area of the Schottky region 82, whereby IFSM characteristics may be improved while Vf characteristics are maintained.

The third nickel silicide film 33c is an ohmic electrode in ohmic contact with the FLR 21. The third nickel silicide film 33c is provided at the FLR 21 in the connecting region 20a of the edge termination region 20. The third nickel silicide film 33c is apart from the field oxide film 15, at a sidewall of the field oxide film 15. Similar to the first nickel silicide films 33a and the second nickel silicide films 33b, the third nickel silicide film 33c has a function of enhancing surge current capability by increasing the amount of the surge current pulled out.

The third nickel silicide film 33c, as described hereinafter, at a connection location between the FLR 21 and the metal material film 52 deposited on the front surface of the semiconductor substrate 30, is formed by causing the semiconductor substrate 30 and the metal material film 52 to react with each other by a heat treatment.

The front surface of the semiconductor substrate 30, excluding a portion thereof in contact with the front electrode 14, is covered by the field oxide film 15. At an uppermost surface of the front surface of the semiconductor substrate 30, the passivation film (not depicted) containing a polyimide is provided. Here, at an upper portion of the n⁺-type channel stopper region, a channel stopper electrode that is in contact with and electrically connected to the n⁺-type channel stopper region may be provided. The channel stopper electrode, for example, may be an aluminum alloy film formed concurrently with the aluminum alloy film 32. A back electrode (second electrode) 19 is provided in an entire area of the back surface (back surface of the n+-type starting substrate 11) of the semiconductor substrate 30 and is electrically connected to the n+-type starting substrate 11.

Figure 6:
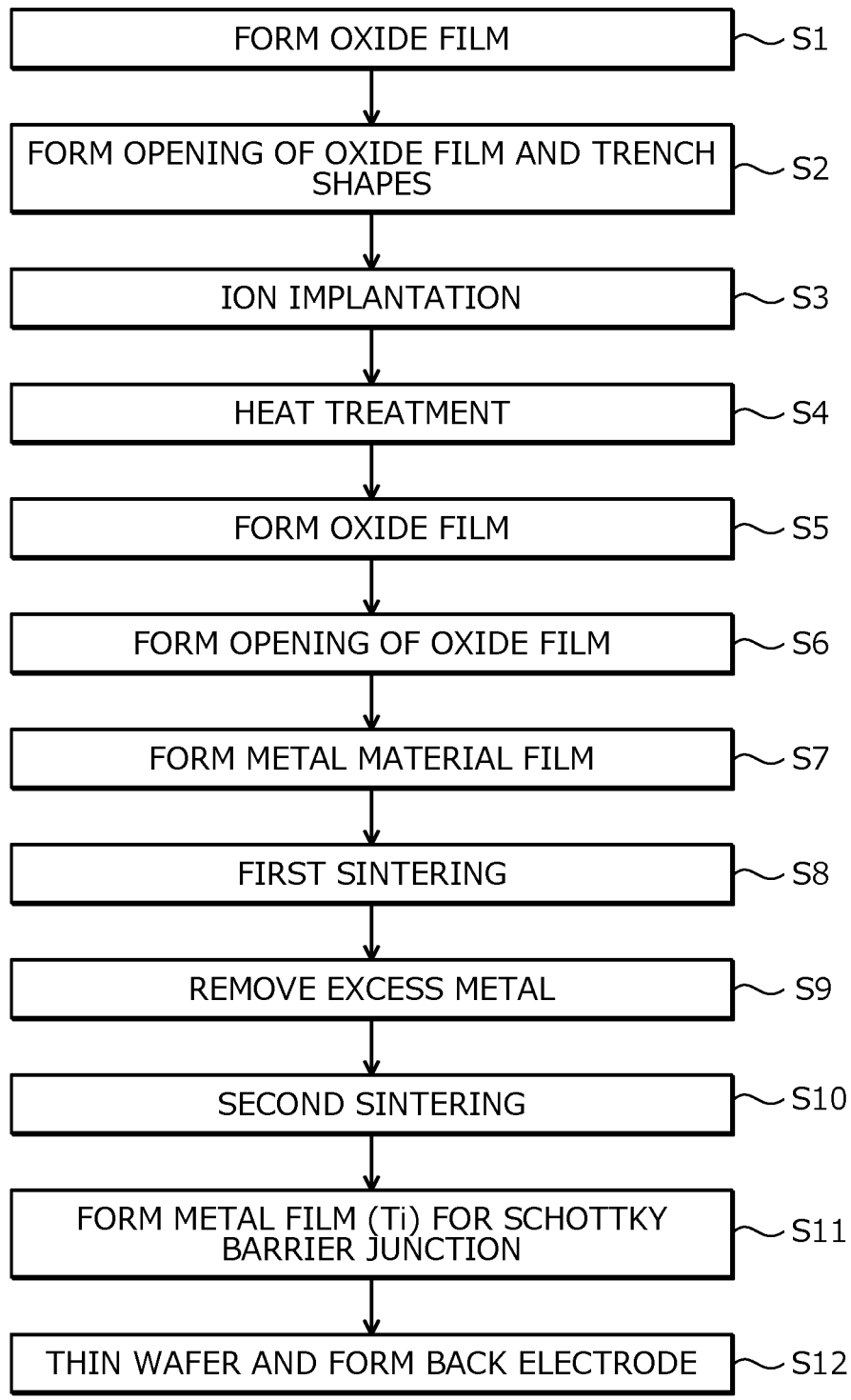
FIG. 6 is a flowchart showing an outline of a method of manufacturing the silicon carbide semiconductor device according to the first embodiment.

Next, a method of manufacturing the silicon carbide semiconductor device 40 according to the first embodiment is described. FIG. 6 is a flowchart showing an outline of the method of manufacturing the silicon carbide semiconductor device according to the first embodiment. FIGS. 7, 8, 9, 10, 11, 12, 13, 14, 15, and 16 are cross-sectional views depicting states of the silicon carbide semiconductor device according to the first embodiment during manufacture.

Figure 7:
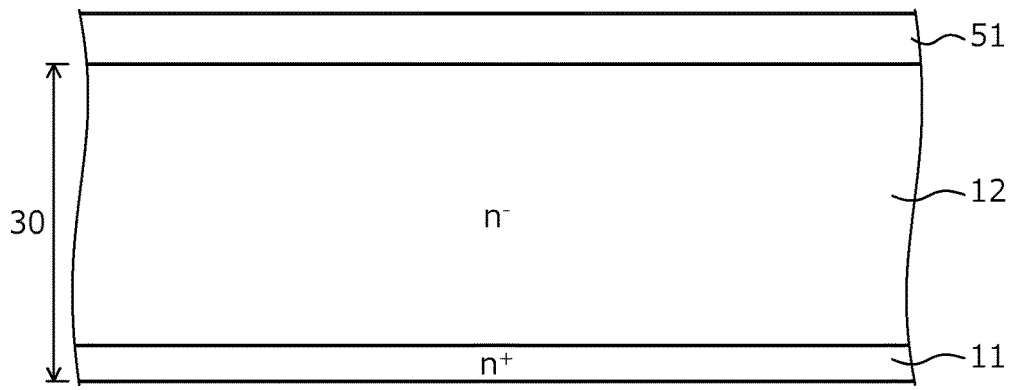
FIG. 7 is a cross-sectional view depicting a state of the silicon carbide semiconductor device according to the first embodiment during manufacture.

First, as depicted in FIG. 7, as the n+-type starting substrate (semiconductor wafer) 11, a four-layer cyclic hexagonal crystal (4H—SiC) substrate containing silicon carbide and doped with nitrogen (N) of a concentration of, for example, about $5 \times 10^{18}/cm^3$ is prepared. The front surface of the n+-type starting substrate 11 may have, for example, an off-angle of about 4 degrees with respect to a (0001) plane. Next, on the front surface of the n+-type starting substrate 11, an n−-type epitaxial layer constituting the n−-type drift region 12 and doped with nitrogen of a concentration of, for example, about $1.8 \times 10^{16}/cm^3$ is grown.

A thickness of the n+-type starting substrate 11 constituting the n+-type cathode region may be, for example, about 350 μm. A thickness of the n−-type epitaxial layer constituting the n−-type drift region 12 may be, for example, about 6 μm. By the processes up to here, the semiconductor substrate (semiconductor wafer) 30 in which the n−-type epitaxial layer constituting the n−-type drift region 12 is stacked on the front surface of the n+-type starting substrate 11 is fabricated. Next, a trench forming mask, for example, an oxide film 51, is formed in an entire area of the front surface of the semiconductor substrate 3 (step S1). As described above, the semiconductor substrate 30 has, as the front surface, a main surface having the n−-type drift region 12 and as the back surface, a main surface having the n+-type starting substrate 11.

Figure 8:
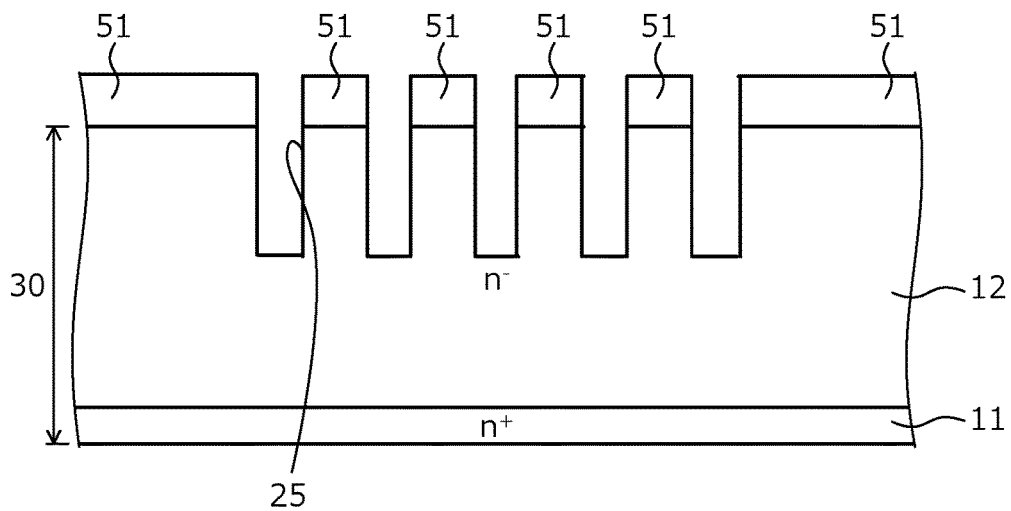
FIG. 8 is a cross-sectional view depicting a state of the silicon carbide semiconductor device according to the first embodiment during manufacture.

Next, as depicted in FIG. 8, the oxide film 51 is selectively removed by photolithography and etching thereby forming an opening, and the trenches 25, which do not reach the n+-type starting substrate 11, are selectively formed from the surface of the n−-type drift region 12 by dry etching (step S2).

Figure 9:
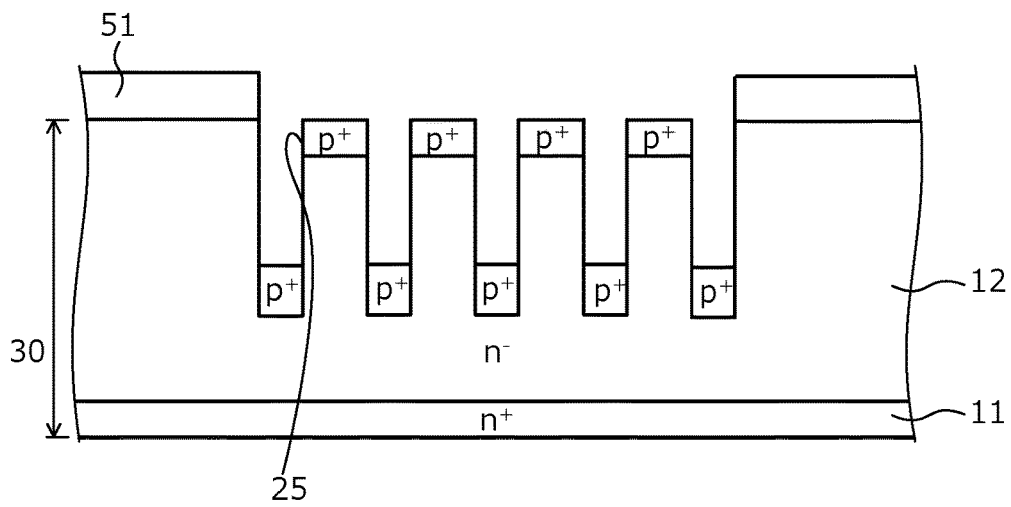
FIG. 9 is a cross-sectional view depicting a state of the silicon carbide semiconductor device according to the first embodiment during manufacture.
Figure 10:
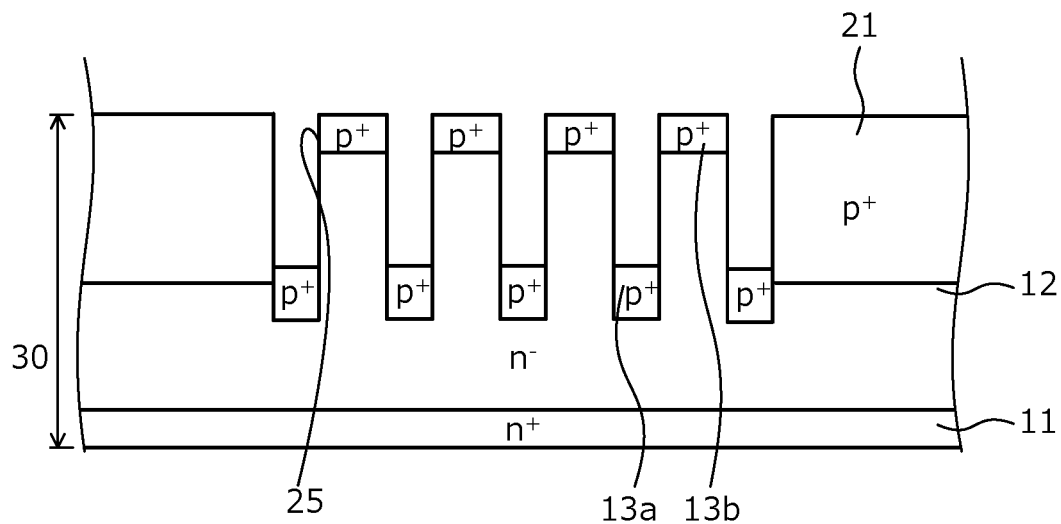
FIG. 10 is a cross-sectional view depicting a state of the silicon carbide semiconductor device according to the first embodiment during manufacture.

Next, as depicted in FIG. 9, the oxide film 51 is selectively removed and by ion implantation, a p-type impurity such as aluminum is implanted between the bottoms of the trenches 25 and the trenches 25, in the active region 10 (step S3). Next, as depicted in FIG. 10, the oxide film 51 is removed and a p-type impurity such as aluminum is selectively implanted at a portion corresponding to the FLR 21. Next, the ion-implanted impurities are activated by a heat treatment (step S4). Similarly, a p-type impurity such as aluminum is implanted in portions corresponding to the p−-type region and the p−−−-type region that configure the JTE structure and an n-type impurity such as nitrogen is implanted in a portion corresponding to the n+-type channel stopper region. As a result, at the bottoms of the trenches 25, one or more of the first p+-type regions 13a configuring the pn diodes, one or more of the second p+-type regions 13b configuring the pn diodes between the trenches 25, the FLR 21, the p−-type region (not depicted) and the p−−−-type region (not depicted) configuring the JTE structure, and the n+-type channel stopper region (not depicted) are each selectively formed.

Figure 11:
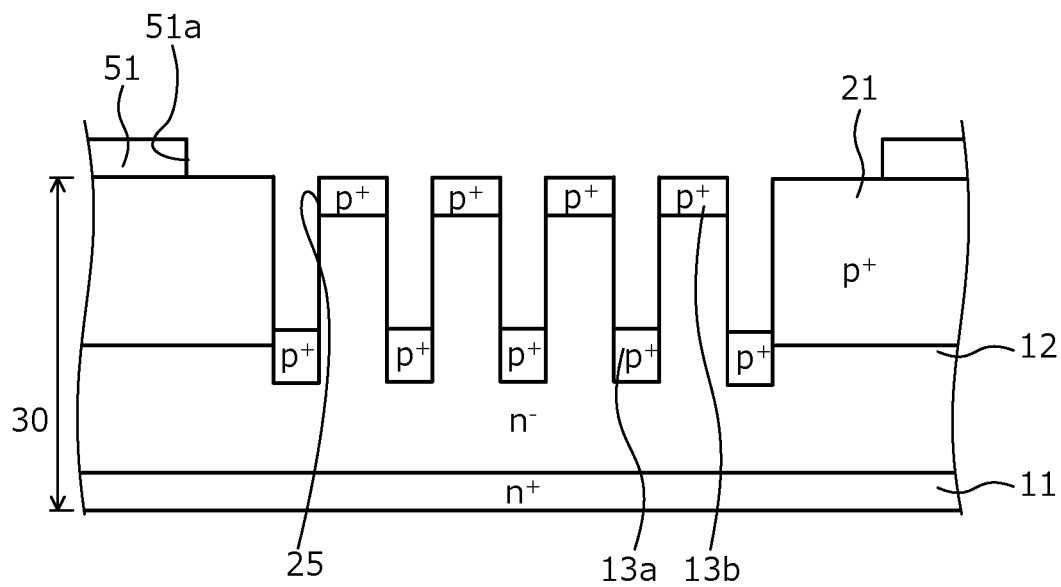
FIG. 11 is a cross-sectional view depicting a state of the silicon carbide semiconductor device according to the first embodiment during manufacture.

Next, as depicted in FIG. 11, the oxide film 51 is formed at the front surface of the semiconductor substrate 30 (step S5), the oxide film 51 is selectively removed by photolithography and etching, thereby, forming an opening 51a (step S6). Thereafter, a mask oxide film 53 is formed and openings are formed at portions where the nickel silicide films 33 are to be formed.

Figure 12:
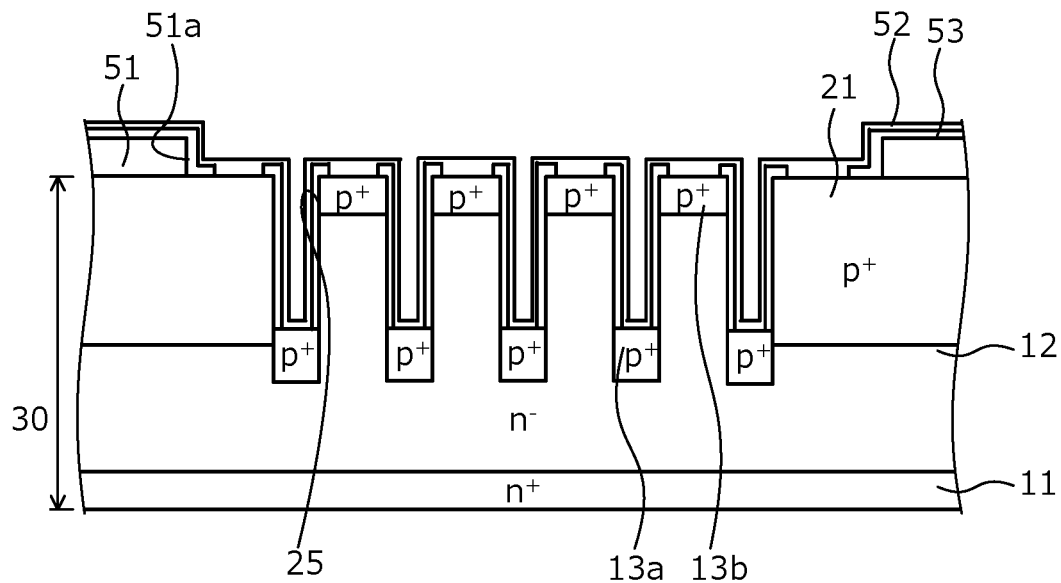
FIG. 12 is a cross-sectional view depicting a state of the silicon carbide semiconductor device according to the first embodiment during manufacture.

Next, as depicted in FIG. 12, for example, by a sputtering method, spanning the front surface (surface) of the semiconductor substrate 30 in the opening 51a of the oxide film 51 from the surface of the oxide film 51, the metal material film 52 is formed on the front surface (step S7). The metal material film 52 is a stacked metal film in which a first nickel film, an aluminum film (metal film containing aluminum), and a second nickel film are sequentially stacked in the order stated herein. In FIG. 12, the first nickel film, the aluminum film, and the second nickel film are collectively depicted as a single layer (the metal material film 52) in the figures. In the description hereinafter, while the metal material film 52 having a three-layer structure is described, the metal material film 52 may be a two-layer stacked metal film in which the aluminum film and the second nickel film are sequentially stacked in the order stated herein. Preferably, a combined thickness of the first nickel film, the aluminum film, and the second nickel film, or the aluminum film and the second nickel film of the metal material film 52 may be in a range of 50 nm to 250 nm.

Figure 13:
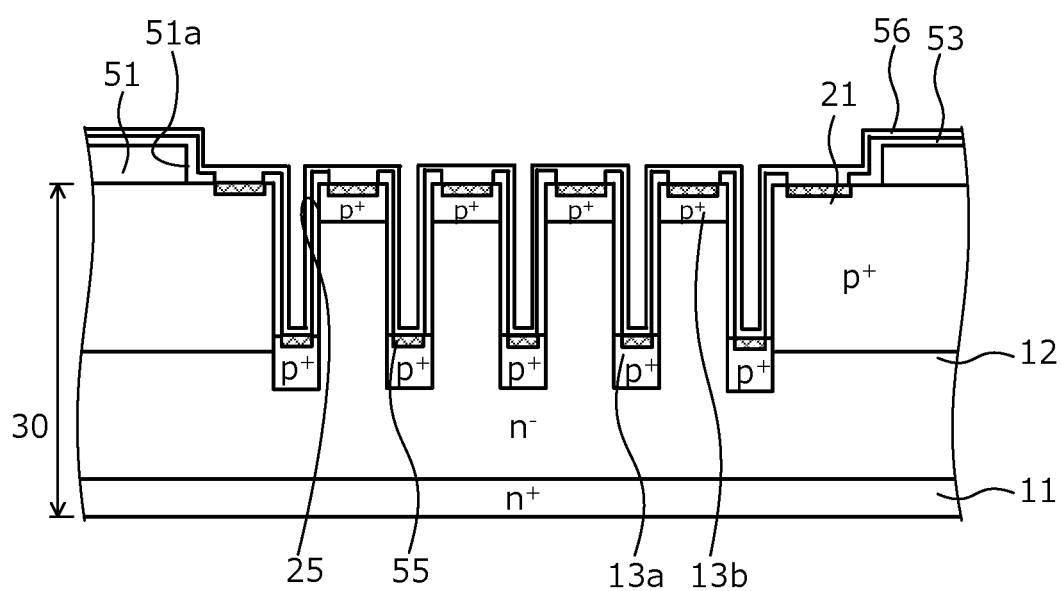
FIG. 13 is a cross-sectional view depicting a state of the silicon carbide semiconductor device according to the first embodiment during manufacture.

Next, as depicted in FIG. 13, a first sintering is performed on the metal material film 52 by a heat treatment (step S8), whereby in the opening 51a of the oxide film 51, an aluminum-nickel-silicon (Al—Ni—Si) compound 55 is synthesized. By thermal diffusion of aluminum atoms into the first nickel film, thermal diffusion of nickel atoms into the semiconductor substrate 30, and thermal diffusion of silicon atoms into the first nickel film and the aluminum film, the Al—Ni—Si compound 55 is formed at contact locations between the metal material film 52 and the semiconductor substrate 30. The Al—Ni—Si compound 55 forms a low-resistance ohmic junction with the high impurity concentration in the first p+-type regions 13a, the second p+-type regions 13b, or the FLR 21.

Figure 14:
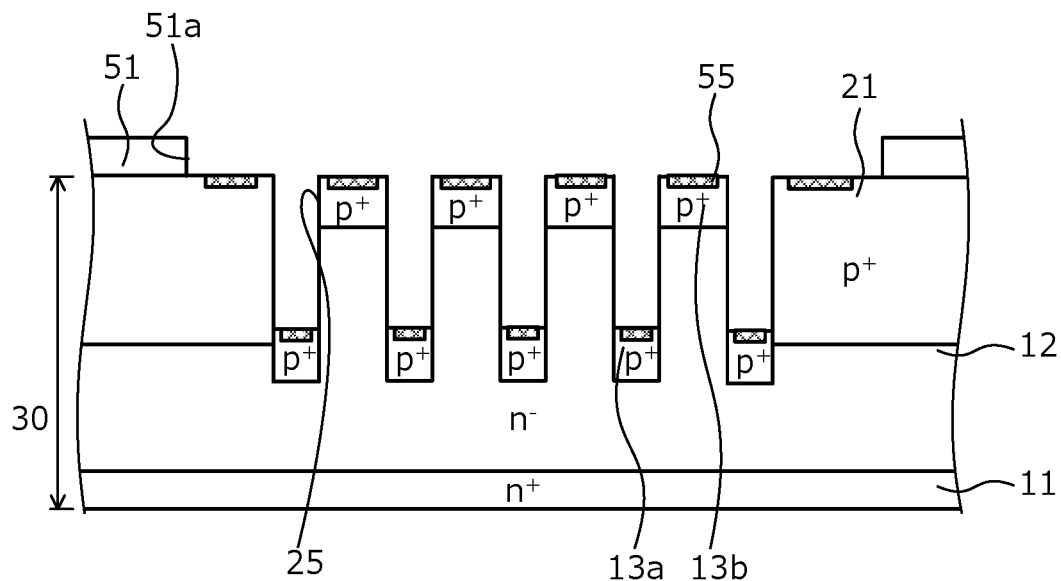
FIG. 14 is a cross-sectional view depicting a state of the silicon carbide semiconductor device according to the first embodiment during manufacture.

Next, as depicted in FIG. 14, excess metal (excess portions) on the oxide film 51 and in the opening 51a of the oxide film 51, and the mask oxide film 53 are removed (step S9). The excess metal is metal other than the Al—Ni—Si compound 55 generated from the metal material film 52 that is unreacted and the metal material film 52 and particularly, is an aluminum-nickel compound 56 that did not contribute to the generation of the Al—Ni—Si compound 55 (refer to FIG. 13).

Figure 15:
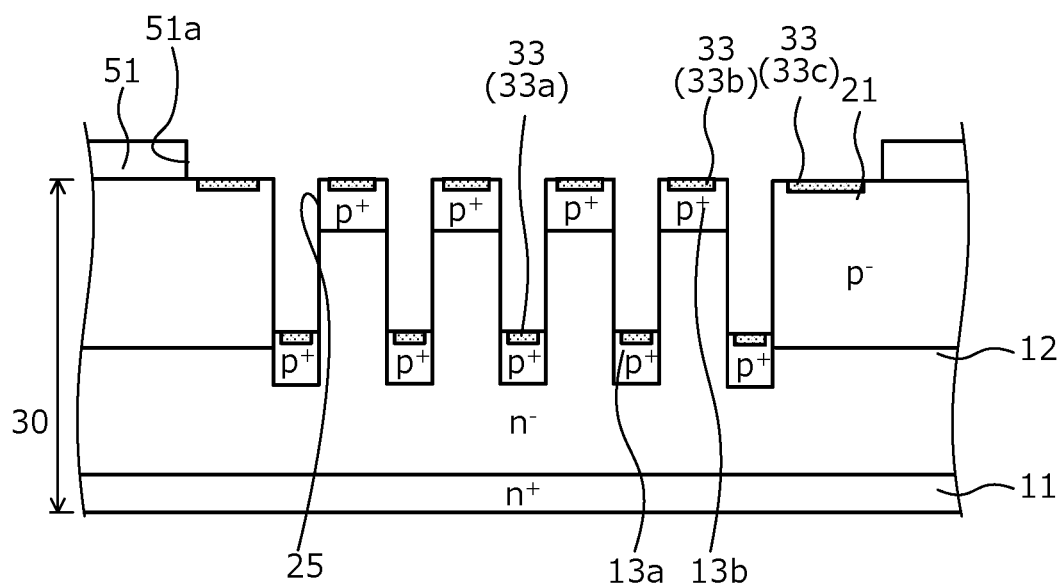
FIG. 15 is a cross-sectional view depicting a state of the silicon carbide semiconductor device according to the first embodiment during manufacture.

Next, as depicted in FIG. 15, a second sintering is performed on the Al—Ni—Si compound 55 by a heat treatment (step S10). By the heat treatment at step S10, a nickel silicide is synthesized in the Al—Ni—Si compound 55 and the Al—Ni—Si compound 55 is converted into the nickel silicide films 33 that form ohmic junctions with the semiconductor substrate 30. As a result, in each opening 51a of the oxide film 51, the nickel silicide films 33, which form an ohmic junction with the semiconductor substrate 30 are formed. A thickness of each of the nickel silicide films 33 is in a range of 100 nm to 500 nm, which is about two times the thickness of the metal material film 52.

Figure 16:
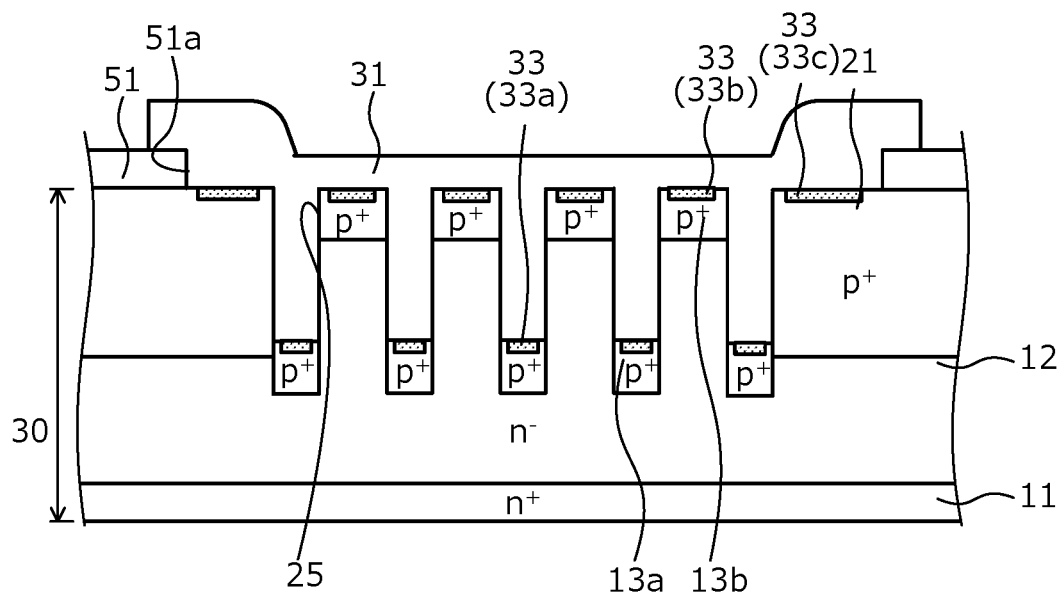
FIG. 16 is a cross-sectional view depicting a state of the silicon carbide semiconductor device according to the first embodiment during manufacture.

Next, as depicted in FIG. 16, for example, the titanium film 31 is formed in an entire area of the front surface of the semiconductor substrate 30 in the contact hole 15a, from the surface of the oxide film 51 by physical vapor deposition (PVD) such as sputtering (step S11). A thickness of the titanium film 31 may be, for example, about 100 nm. The titanium film 31 may extend on the field oxide film 15, from inside the contact hole 15a. The oxide film 51 that is left constitutes the field oxide film 15.

Next, for example, the titanium film 31 is sintered by a heat treatment at a temperature of about 500 degrees C. for period of about 10 minutes. By this heat treatment, the Schottky barrier junctions between the titanium film 31 and the n⁻-type drift region 12 are formed. Next, for example, an aluminum alloy film having a thickness of, for example, about 5 μm is formed in an entire area of the surface of the field oxide film 15, from the surface of the titanium film 31 by physical vapor deposition such as sputtering. Next, the aluminum alloy film is selectively removed by photolithography and etching and is left on the surface of the titanium film 31 as the aluminum alloy film 32 that constitutes the front electrode 14.

Next, the front surface of the semiconductor substrate 30 (semiconductor wafer) is covered by a protective film (not depicted) and thereafter, the semiconductor substrate 30 is ground from the back surface thereof, whereby the thickness of the semiconductor substrate 30 is reduced to a product thickness. Next, for example, nickel, titanium, etc. is deposited in an entire area of the back surface (back surface of the n⁺-type starting substrate 11) of the semiconductor substrate 30 by physical vapor deposition such as sputtering and thereafter, the back electrode 19 is formed by laser annealing (step S12). Thereafter, the protective film at the front surface of the semiconductor substrate 3 is removed and subsequently, the semiconductor substrate 30 is diced (cut) into individual chips, thereby completing the silicon carbide semiconductor device 40 depicted in FIG. 1.

As described above, according to the first embodiment, the trench structure is configured in which the fine ohmic striped structure is provided at the bottom of the trench structure, which has a stripe-shape. The p⁺-type regions are provided at portions of the surface of the n⁻-type drift region between the trenches and at the bottoms thereof. As described, the area of the ohmic regions is increased, whereby the flow of current to the p⁺-type regions during a surge is facilitated and the surge capability (IFSM) may be ensured. Thus, characteristics of both the surge current capability and the on-voltage may be improved. Further, the sidewalls of the trenches are in contact with the front electrode and thus, the area of the SBD structure configured by the Schottky barrier junctions between the front electrode and the n⁻-type drift region is increased, the on-voltage increases, and the Vf may be reduced. Further, the sidewall of the FLR covers the sidewalls of the outermost ones of the trenches closest to the edge termination region and is in contact with the first p⁺-type regions. As a result, from the outermost ones of the trenches closest to the edge termination region, leakage of current from the Schottky regions during reverse bias may be prevented.

Figure 17:
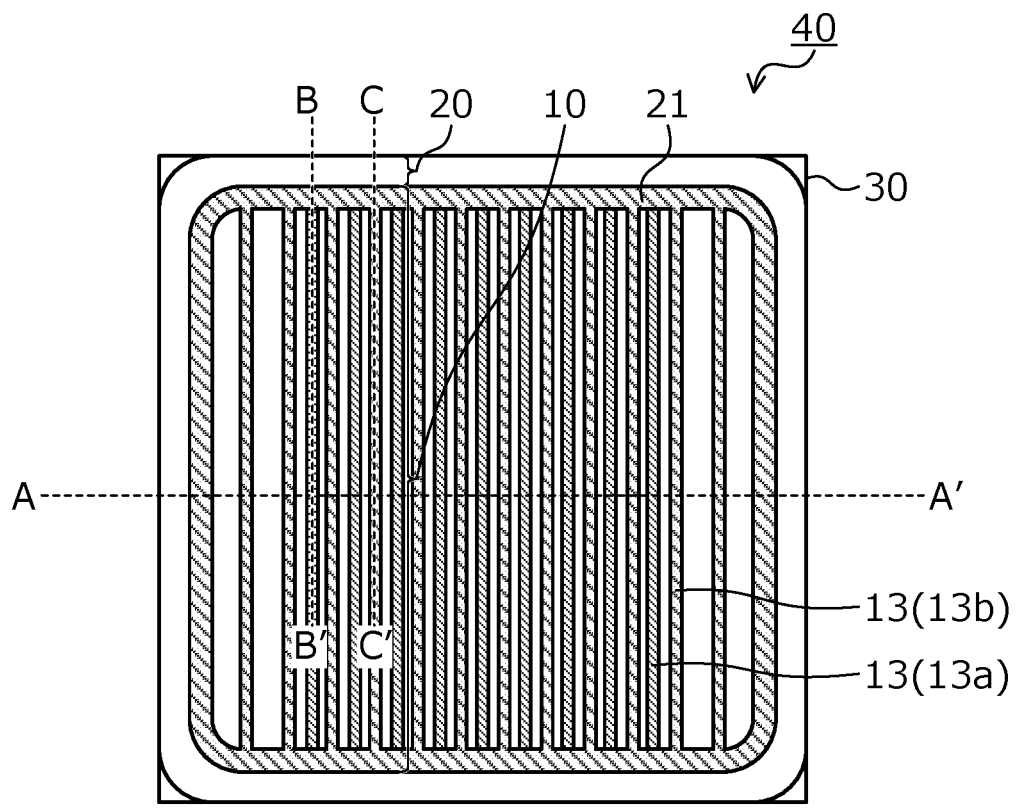
FIG. 17 is a plan view depicting a layout when the silicon carbide semiconductor device according to a second embodiment is viewed from the front side of the semiconductor substrate thereof.
Figure 18:
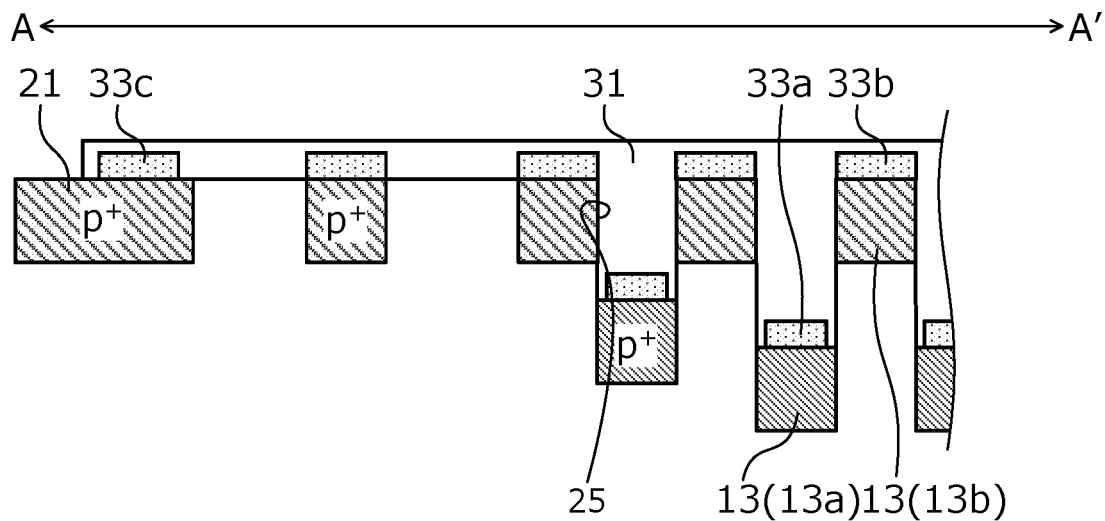
FIG. 18 is a cross-sectional view depicting the structure of the silicon carbide semiconductor device according to the second embodiment along cutting line A-A' in FIG. 17.
Figure 19:
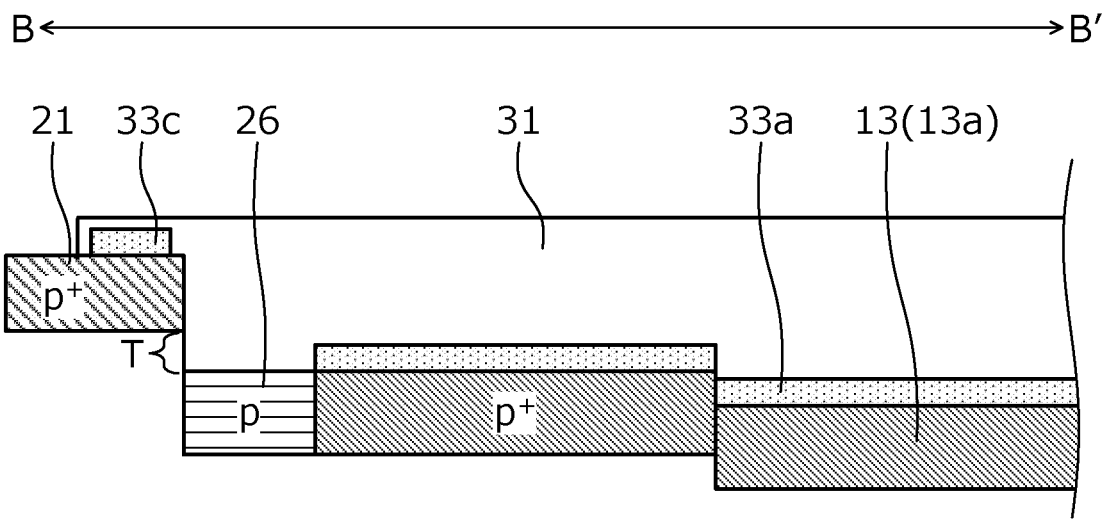
FIG. 19 is a cross-sectional view depicting the structure of the silicon carbide semiconductor device according to the second embodiment along cutting line B-B' in FIG. 17.
Figure 20:
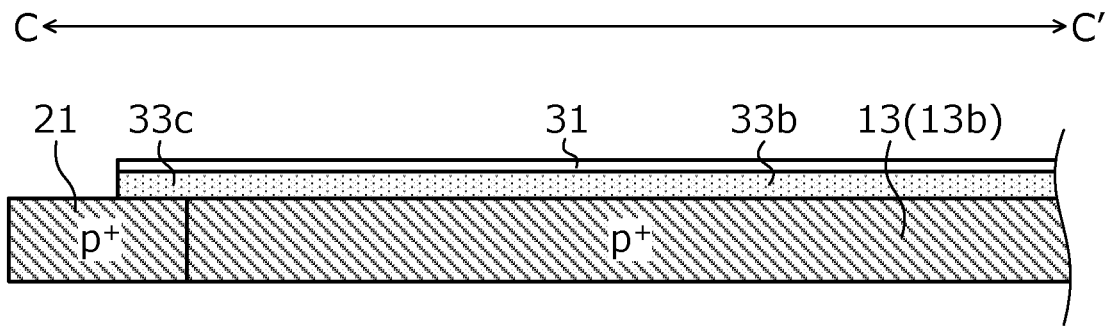
FIG. 20 is a cross-sectional view depicting the structure of the silicon carbide semiconductor device according to the second embodiment along cutting line C-C' in FIG. 17.

Next, a structure of a silicon carbide semiconductor device according to a second embodiment is described. FIG. 17 is a plan view depicting a layout when the silicon carbide semiconductor device according to the second embodiment is viewed from the front side of the semiconductor substrate thereof. FIG. 18 is a cross-sectional view depicting the structure of the silicon carbide semiconductor device according to the second embodiment along cutting line A-A' in FIG. 17. FIG. 19 is a cross-sectional view depicting the structure of the silicon carbide semiconductor device according to the second embodiment along cutting line B-B' in FIG. 17. FIG. 20 is a cross-sectional view depicting the structure of the silicon carbide semiconductor device according to the second embodiment along cutting line C-C' in FIG. 17.

The silicon carbide semiconductor device 40 according to the second embodiment differs from the silicon carbide semiconductor device 40 according to the first embodiment in that the trenches 25 are gathered in a center portion and a distance between the FLR 21 and the first p⁺-type regions 13a is relatively larger. As depicted in FIG. 17, in a direction in which the trenches 25 are arranged (direction orthogonal to the longitudinal direction), close to the edge termination region 20, regions between the second p⁺-type regions 13b are free of the trenches 25 and are free of the first p⁺-type regions 13a.

Furthermore, depths (distances from the front surface of the semiconductor substrate 30) of the first p⁺-type regions 13a and the first nickel silicide films 33a are deeper stepwise the farther the first p⁺-type regions 13a and the first nickel silicide films 33a are from the edge termination region 20. As depicted in FIG. 18, in the direction in which the trenches 25 are arranged, the outermost ones of the trenches 25 closest to the edge termination region 20 are shallower than others of the trenches 25 and the depths of the first p⁺-type regions 13a and the first nickel silicide films 33a are deeper stepwise the farther the first p⁺-type regions 13a and the first nickel silicide films 33a are from the edge termination region 20. Similarly, in the longitudinal direction of the trenches 25, as depicted in FIG. 19, the outermost ones of the trenches 25 closest to the edge termination region 20 are shallower than the others of the trenches 25 and the depths of the first p⁺-type regions 13a and the first nickel silicide films 33a are deeper stepwise.

Further, in the longitudinal direction of the trenches 25, in a direction away from the edge termination region 20, the depth of each of the trenches 25 may gradually increase in a sloped shape and the depths of each of the first p⁺-type regions 13a and the first nickel silicide films 33a may gradually increase in a sloped shape.

Further, in the second embodiment, as depicted in FIG. 19, the FLR 21 is provided in the semiconductor substrate 30, at the surface of the semiconductor substrate 30 and the lower surface of the FLR 21 (surface facing the second main surface) is shallower than are the trenches 25 and shallower than are top surfaces (surfaces facing the first main surface) of the first p⁺-type regions 13a. Thus, the p-type non-operating region 26 is deeper than and apart from the FLR 21 by a depth T. The depth T is made as narrow as possible, whereby leakage of current from the Schottky region 82 in each of the trenches 25 during reverse bias may be prevented. The lower surface of the FLR 21 is deeper than are ends of the trenches 25 and is connected to the p-type non-operating region 26, whereby T=0 may be set. On the other hand, as depicted in FIG. 20, the second p⁺-type regions 13b, in the longitudinal direction, is in contact with the FLR 21 provided in the edge termination region 20. Further, in an instance in which the third nickel silicide film 33c is further provided at the FLR 21, the second nickel silicide films 33b of the ohmic regions 81 are continuous with the third nickel silicide film 33c.

The silicon carbide semiconductor device 40 according to the second embodiment may be manufactured by a method similar to the method of manufacturing of the first embodiment by changing therein the position of the oxide film 51 for forming the trenches 25 so that the trenches 25 are gathered in the center portion and by changing the depths of the trenches 25.

As described above, according to the second embodiment, the trenches are gathered in the center portion, and the distance between the FLR and the p⁺-type regions is large. Further, the FLR is provided in the semiconductor substrate, at the surface thereof and is shallower than are the trenches, the lower surface of the FLR being shallower than are the top surfaces of the first p⁺-type regions. Further, the depths of the first p⁺-type regions and the first nickel silicide film increase stepwise with increasing distance from the edge termination region. As a result, leakage of current from the Schottky regions in the trenches during reverse bias may be prevented.

Figure 21:
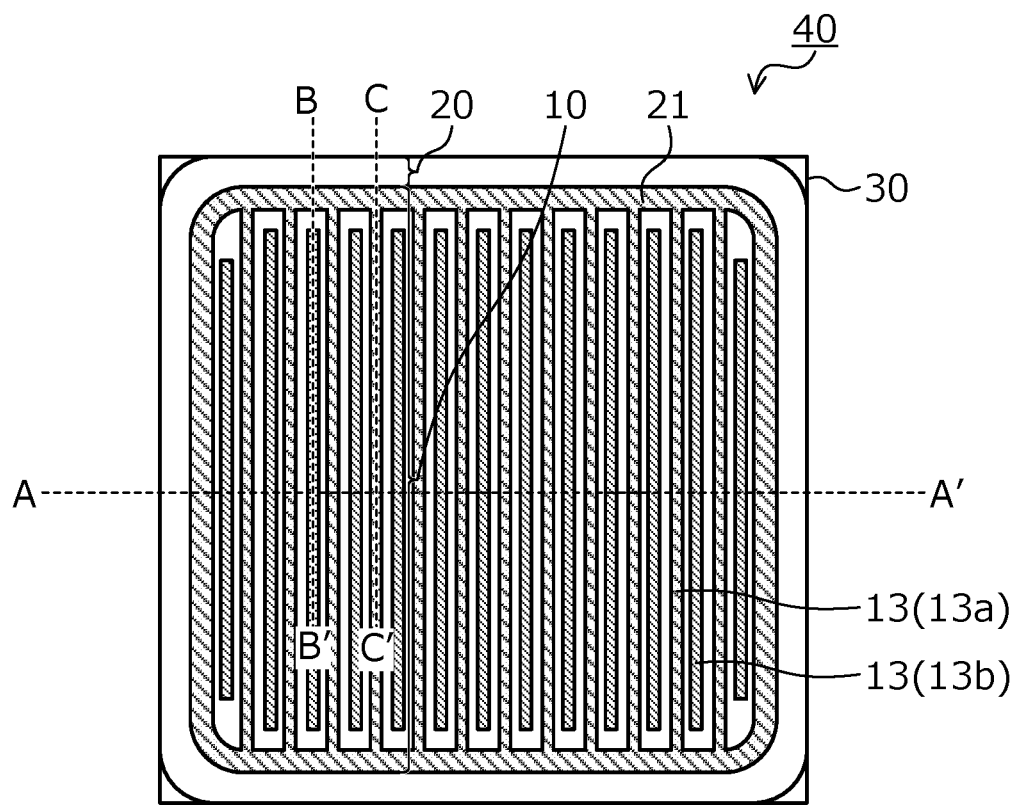
FIG. 21 is a plan view depicting a layout when the silicon carbide semiconductor device according to a third embodiment is viewed from the front side of the semiconductor substrate thereof.
Figure 22:
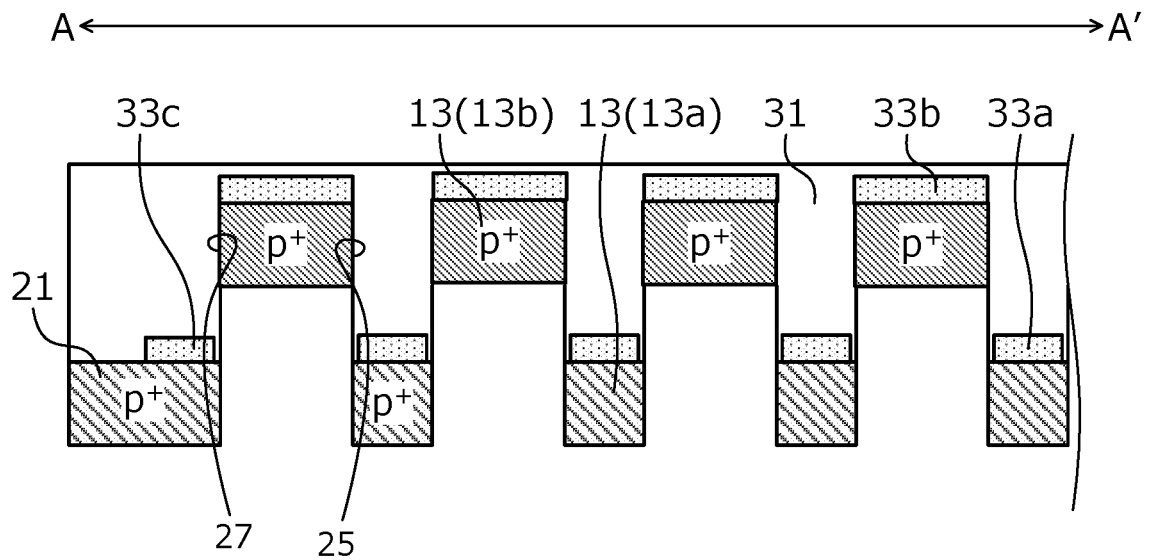
FIG. 22 is a cross-sectional view of the structure of the silicon carbide semiconductor device according to the third embodiment along cutting line A-A' in FIG. 21.
Figure 23:
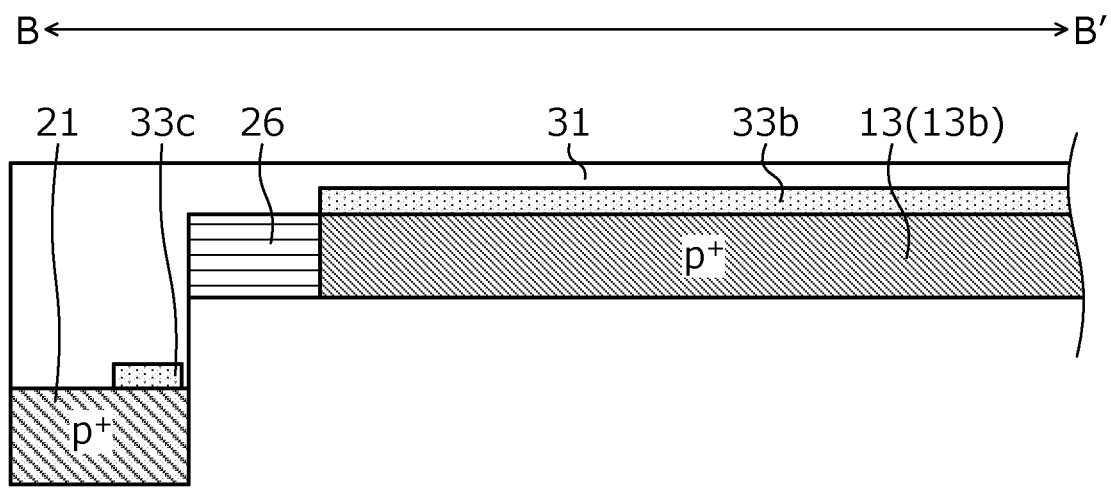
FIG. 23 is a cross-sectional view of the structure of the silicon carbide semiconductor device according to the third embodiment along cutting line B-B' in FIG. 21.
Figure 24:
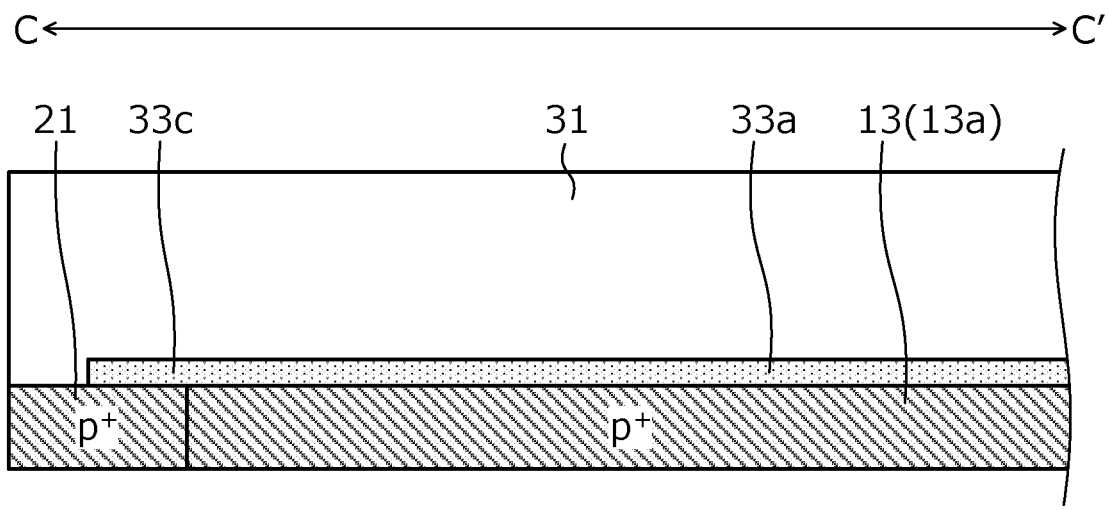
FIG. 24 is a cross-sectional view of the structure of the silicon carbide semiconductor device according to the third embodiment along cutting line C-C' in FIG. 21.

Next, a structure of a silicon carbide semiconductor device according to a third embodiment is described. FIG. 21 is a plan view depicting a layout when the silicon carbide semiconductor device according to the third embodiment is viewed from the front side of the semiconductor substrate thereof. FIG. 22 is a cross-sectional view of the structure of the silicon carbide semiconductor device according to the third embodiment along cutting line A-A' in FIG. 21. FIG. 23 is a cross-sectional view of the structure of the silicon carbide semiconductor device according to the third embodiment along cutting line B-B' in FIG. 21. FIG. 24 is a cross-sectional view of the structure of the silicon carbide semiconductor device according to the third embodiment along cutting line C-C' in FIG. 21.

The silicon carbide semiconductor device 40 according to the third embodiment differs from the silicon carbide semiconductor device 40 according to the first embodiment in that a second trench 27 that surrounds the active region 10 is provided in the edge termination region 20, the FLR 21 is provided at the bottom of the second trench 27, and the FLR 21 and the first p⁺-type regions 13a provided at the bottoms of the trenches 25 are connected. As depicted in FIG. 22, the trenches 25 and the second trench 27 are connected by the edge termination region 20. Further, at portions where the trenches 25 and the second trench 27 are connected, as depicted in FIG. 24, the third nickel silicide film 33c on the FLR 21 and the first nickel silicide films 33a in the trenches 25 are connected.

Further, in the third embodiment, at the surfaces of the mesa portions between the trenches 25 that are adjacent to one another, the second p⁺-type regions 13b and the second nickel silicide films 33b are provided. As depicted in FIG. 23, to prevent leakage of current from the second nickel silicide films 33b, the p-type non-operating region 26 is provided between a sidewall of the second trench 27 and the second p⁺-type regions 13b.

Figure 25:
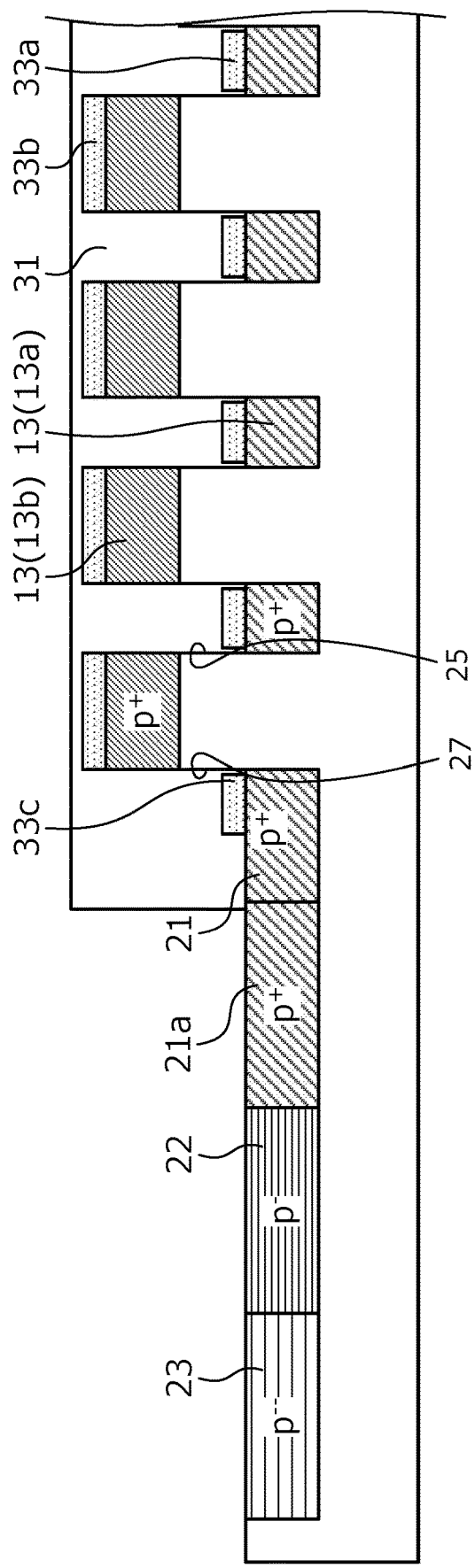
FIG. 25 is a cross-sectional view depicting the structure of an edge termination region in the silicon carbide semiconductor device according to the third embodiment.
Figure 26:
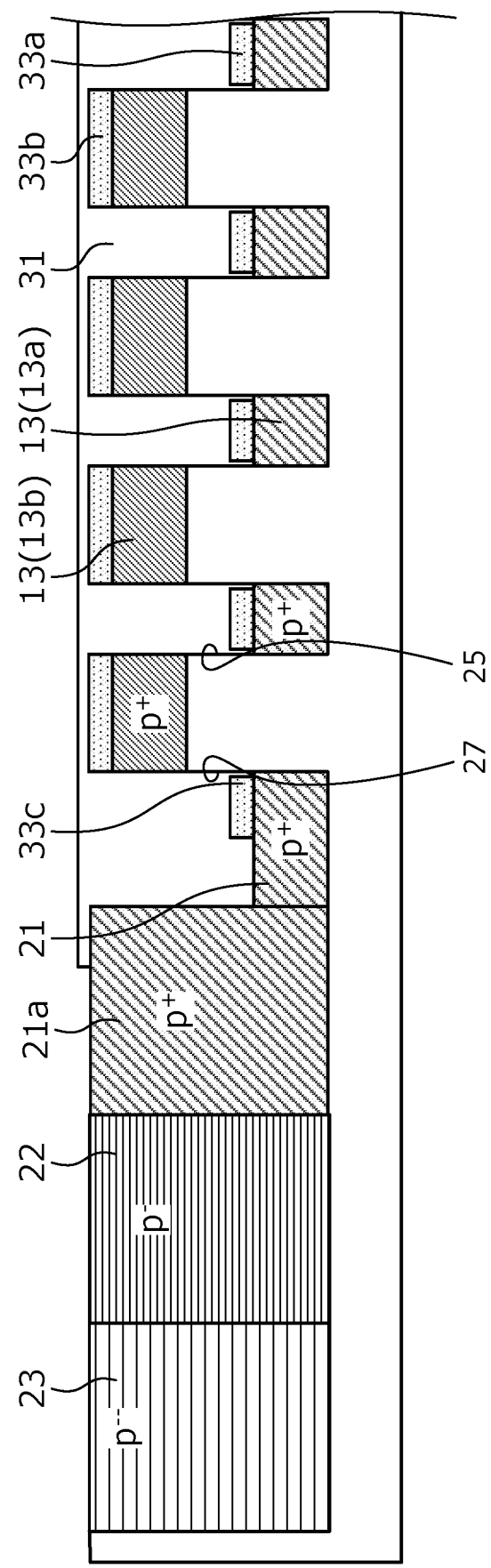
FIG. 26 is a cross-sectional view depicting the structure of the edge termination region in the silicon carbide semiconductor device according to the third embodiment.
Figure 27:
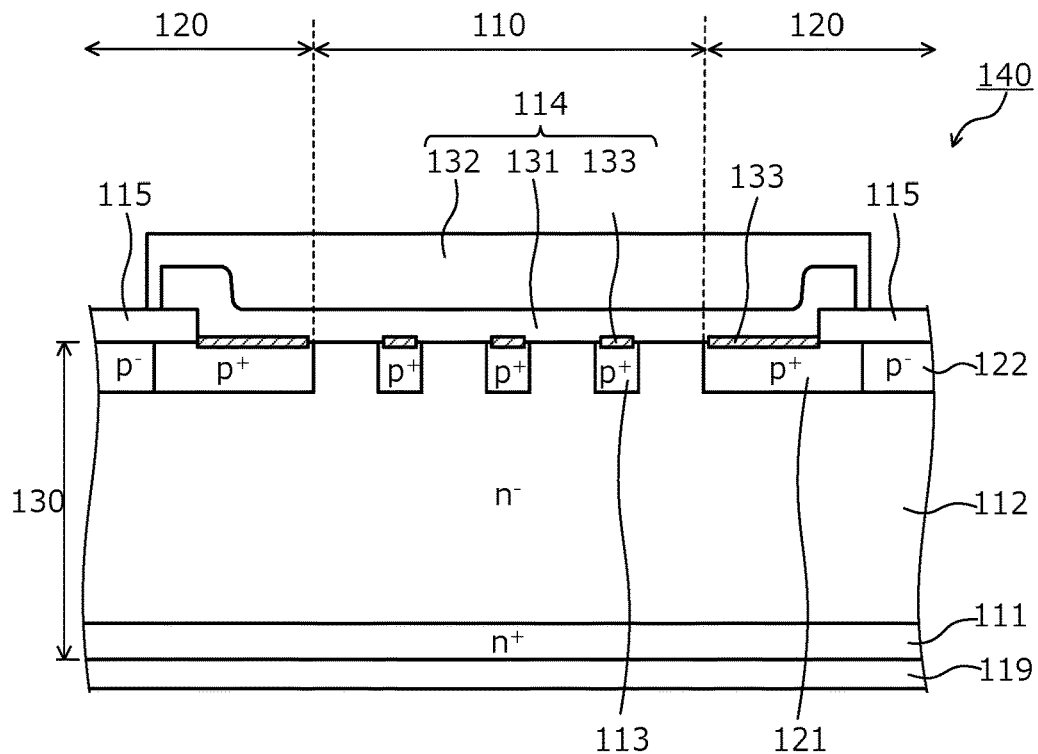
FIG. 27 is a cross-sectional view depicting a structure of a conventional silicon carbide semiconductor device.
Figure 28:
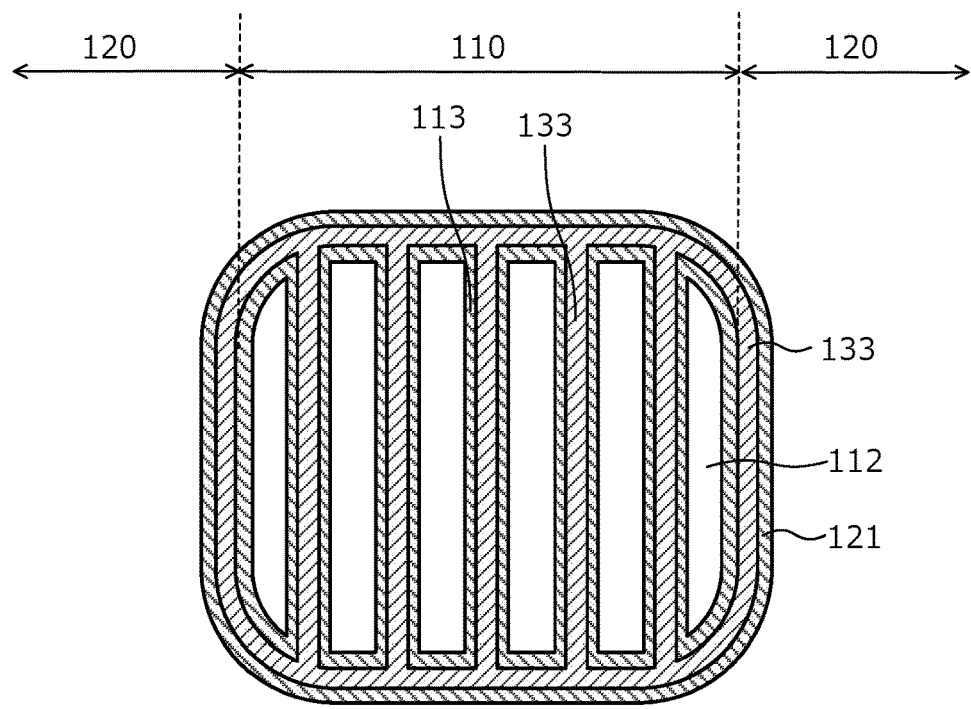
FIG. 28 is a plan view depicting a layout when the conventional silicon carbide semiconductor device is viewed from a front side of a semiconductor substrate thereof.

FIGS. 25 and 26 are cross-sectional views depicting the structure of the edge termination region in the silicon carbide semiconductor device according to the third embodiment. In the third embodiment, the FLR 21 is provided at the bottom of the second trench 27 and thus, a portion 21a extending toward the chip end from the FLR 21 of the connecting region 20a of the edge termination region 20, a p⁻-type region 22 configuring the JTE structure, and a p⁻⁻⁻-type region 23 configuring the JTE structure, as depicted in FIG. 25, may be provided at the bottom of the second trench 27 similarly to the FLR 21. In this instance, the second trench 27 may be provided to the chip end.

Further, as depicted in FIG. 26, configuration may be such that the second trench 27 is not provided to the chip end. In this instance, the portion 21a of the FLR 21 covers an entire area of an outer sidewall of the second trench 27 (the sidewall closest to the chip end) and is continuous with the FLR 21. Here, the portion 21a of the FLR 21, the p⁻-type region 22, and the p⁻⁻⁻-type region 23 are provided at a same depth from the surface of the semiconductor substrate 30 as is the FLR 21, whereby from the FLR 21 to the p⁻⁻⁻-type region 23, lower surfaces of the p-type regions are formed at the same depth. Further, the FLR 21a, which extends from the connecting region 20a of the edge termination region 20, in a direction toward the chip end, may be omitted. In this instance, the p⁻-type region 22 covers the outer sidewall of the second trench 27 and is in contact with the FLR 21. Further, the depths of the portion 21a of the FLR 21, the p⁻-type region 22, and the p⁻⁻⁻-type region 23 may vary stepwise, decreasing in a direction to the chip end. For example, the portion 21a of the FLR 21 may be deepest, the p⁻-type region 22 may be shallower than the portion 21a of the FLR 21, the p⁻⁻⁻-type region 23 may be shallower than the p⁻-type region 22.

The silicon carbide semiconductor device 40 according to the third embodiment may be manufactured by a method similar to the method of manufacturing of the first embodiment by forming the second trench 27 in the edge termination region 20 and forming the FLR 21 in the second trench 27.

As described above, according to the third embodiment, the FLR is provided in the second trench and the first p⁺-type regions in the trenches are connected to the FLR. Even with this configuration, effects similar to those of the first embodiment are obtained.

In the first to third embodiments, the width of the second p⁺-type regions 13b may be narrower than the width of the trenches 25, a region where the n⁻-type drift region 12 is exposed between the trenches 25 may be left, and the Schottky region 82 may be left on the top surface of the semiconductor substrate 30. Similarly, a width of the first p⁺-type regions 13a may be narrower than the width of the trenches 25, a region where the n⁻-type drift region 12 is exposed at the bottoms of the trenches 25 may be left, and the Schottky regions 82 may be left at the bottoms of the trenches 25.

In the foregoing, the present invention, without limitation to the embodiments described, may be variously modified within a range not departing from the spirit of the invention and is applicable to silicon carbide semiconductor devices that have an ohmic electrode that forms an ohmic junction with p-type regions disposed in a predetermined pattern.

In particular, for example, the present invention is useful for silicon carbide semiconductor devices that are configured to reduce contact resistance between a p-type region (or a p⁺-type contact region disposed between the p-type region and a main surface of a semiconductor substrate) and an ohmic electrode, silicon carbide semiconductor devices that have a structure in which an ohmic electrode that forms an ohmic junction with a p-type region and an oxide film are in contact with each other.

According to the invention described above, p⁺-type regions (first and second second-conductivity-type regions) are provided at the bottom and surface portions of the n⁻-type drift region (first-conductivity-type region) between the trenches. As described, the area of the ohmic regions is increased, whereby flow of current to the p⁺-type regions during a surge is facilitated and the surge capability (IFSM) may be ensured. Further, a sidewall of the FLR (third second-conductivity-type region) covers a sidewall of an outermost trench closest to the edge termination region, among the trenches, and is in contact with the first p⁺-type regions (first second-conductivity-type regions). As a result, leakage of current from the Schottky region from the outermost trench closest to the edge termination region during reverse bias may be prevented.

The silicon carbide semiconductor device according to the present invention achieves an effect in that a low-resistance ohmic electrode is formed, whereby low Vf characteristics are maintained while surge current capability may be increased and leakage current may be reduced.

As described, the silicon carbide semiconductor device according to the present invention is useful for power semiconductor devices used in power converting equipment, power source devices of various types of industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate containing silicon carbide, the semiconductor substrate having an active region and a termination region that surrounds a periphery of the active region, the semiconductor substrate having a first main surface and a second main surface that are opposite to each other;
   a first-conductivity-type region provided in the semiconductor substrate and exposed at the first main surface of the semiconductor substrate, the first-conductivity-type region having a first surface and a second surface that are opposite to each other, the second surface facing the semiconductor substrate;
   a plurality of first trenches provided in the first-conductivity-type region, from the first surface of the first-conductivity-type region, in the active region;
   a plurality of first second-conductivity-type regions provided, respectively, at respective ones of bottoms of the plurality of first trenches, in the active region, the plurality of first second-conductivity-type regions being in contact with the first-conductivity-type region;
   a first silicide film provided on a corresponding one of the plurality of first second-conductivity-type regions with which a first ohmic junction is formed;
   a plurality of second second-conductivity-type regions each provided between a corresponding adjacent two of the plurality of first trenches, in the active region, the plurality of second second-conductivity-type regions being in contact with the first-conductivity-type region;
   a second silicide film provided on a corresponding one of the plurality of second second-conductivity-type regions with which a second ohmic junction is formed;
   a first electrode in contact with the first silicide film, the plurality of first second-conductivity-type regions, the second silicide film, the plurality of second second-conductivity-type regions, and the first-conductivity-type region;
   a second electrode provided at the second main surface of the semiconductor substrate; and
   a third second-conductivity-type region provided in the termination region, the third second-conductivity-type region surrounding the active region, wherein
   the active region includes
      a plurality of ohmic regions, each of which is a region where the first electrode is in contact with either the first silicide film where the first ohmic junction is formed or the second silicide film where the second ohmic junction is formed,
      a plurality of non-operating regions, each of which is a region where the first electrode is in contact with either one of the plurality of first second-conductivity-type regions or one of the plurality of second second-conductivity-type regions, each non-operating region not overlapping any of the plurality of ohmic regions in a plan view of the silicon carbide semiconductor device, and
      a plurality of Schottky regions, each of which is a region where the first electrode forms a Schottky barrier junction with the first-conductivity-type region, and
   the plurality of ohmic regions, the plurality of non-operating regions, and the plurality of Schottky regions each a stripe shape.

2. The silicon carbide semiconductor device according to claim 1, wherein
   the third second-conductivity-type region is provided in a surface layer of the semiconductor substrate, and
   the third second-conductivity-type region has a sidewall that covers a sidewall of an outermost one of the plurality of first trenches that is closest to the termination region and is in contact with the plurality of first second-conductivity-type regions.

3. The silicon carbide semiconductor device according to claim 1, wherein
   the third second-conductivity-type region is provided in a surface layer of the semiconductor substrate, and
   the third second-conductivity-type region and the plurality of second second-conductivity-type regions each have bottom surfaces that face the second main surface, and the bottom surface of the third second-conductivity-type region is closer to the second main surface than are the bottom surfaces of the plurality of second second-conductivity-type regions.

4. The silicon carbide semiconductor device according to claim 1, wherein
   an outermost one of the plurality of first trenches that is closest to the termination region is shallower than are the rest of the plurality of first trenches.

5. The silicon carbide semiconductor device according to claim 1, further comprising
   a second trench provided in the termination region, surrounding the active region and being connected to the plurality of first trenches, wherein
   the third second-conductivity-type region is provided at a bottom of the second trench.

6. The silicon carbide semiconductor device according to claim 5, wherein
   the third second-conductivity-type region is connected to the plurality of first second-conductivity-type regions.

7. The silicon carbide semiconductor device according to claim 5, further comprising
   a fourth second-conductivity-type region provided in the termination region, wherein
   the third second-conductivity-type region and the fourth second-conductivity-type region are respectively provided at the bottom of the second trench in different areas thereof.

8. The silicon carbide semiconductor device according to claim 5, further comprising
   a fourth second-conductivity-type region provided in the termination region, in a surface layer of the semiconductor substrate, wherein
   the fourth second-conductivity-type region covers a sidewall of the second trench and is continuous with the third second-conductivity-type region.

9. The silicon carbide semiconductor device according to claim 1, wherein
   each of the plurality of Schottky regions is a region where at a sidewall of a corresponding one of the plurality of first trenches, the first electrode is in contact with the first-conductivity-type region.

10. The silicon carbide semiconductor device according to claim 1, wherein
the active region further includes a plurality of second-conductivity-type non-operating regions that are free of the first silicide film, each second-conductivity-type non-operating region being located between a corresponding one of the plurality of first second-conductivity-type regions and the third second-conductivity-type region in a longitudinal direction of the first trenches.

11. The silicon carbide semiconductor device according to claim 1, wherein
the silicon carbide semiconductor device is a diode.

* * * * *